US006423462B1

(12) United States Patent
Kunita

(10) Patent No.: US 6,423,462 B1
(45) Date of Patent: Jul. 23, 2002

(54) IMAGE FORMING MATERIAL

(75) Inventor: Kazuto Kunita, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/627,430

(22) Filed: Jul. 27, 2000

(30) Foreign Application Priority Data

Jul. 27, 1999 (JP) .......................................... 11-211964
Jul. 27, 1999 (JP) .......................................... 11-211965

(51) Int. Cl.$^7$ ............................ G03F 7/021; G03F 7/30

(52) U.S. Cl. ....................... 430/156; 430/157; 430/160; 430/161; 430/162; 430/273.1; 430/288.1; 430/302

(58) Field of Search ............................. 430/156, 273.1, 430/157, 160, 161, 162, 302, 288.1

(56) References Cited

U.S. PATENT DOCUMENTS

| | | | | |
|---|---|---|---|---|
| 3,905,815 A | | 9/1975 | Bonham | |
| 4,104,072 A | | 8/1978 | Golda | |
| 4,544,622 A | | 10/1985 | Kausch | |
| 4,886,731 A | * | 12/1989 | Sypek et al. | 430/156 |
| 5,405,731 A | | 4/1995 | Chandrasekaran | |
| 5,532,105 A | * | 7/1996 | Yamadera et al. | 430/156 |
| 5,925,490 A | | 7/1999 | Loerzer | |

FOREIGN PATENT DOCUMENTS

| | | |
|---|---|---|
| GB | 2023861 A1 | 1/1980 |

* cited by examiner

*Primary Examiner*—John S. Chu
(74) *Attorney, Agent, or Firm*—Burns, Doane, Swecker & Mathis, LLP

(57) ABSTRACT

An image forming material having a support having disposed in an order thereon an acid-crosslinkable layer, which contains a compound that generates an acid by light or heat and a compound crosslinkable by the acid generated and whose alkali solubility is lowered by the crosslinking, and a radical-polymerizable layer, which contains a compound that generates a radical by light or heat and a compound capable of undergoing a radical polymerization and whose alkali solubility is lowered by the polymerization.

14 Claims, No Drawings

IMAGE FORMING MATERIAL

BACKGROUND OF THE INVENTION

1. Field of the Invention

The present invention relates to an image forming material which can be used as a planographic plate material, a color proof, a photoresist, or a color filter. More specifically, the present invention relates to a negative-type image forming material, suitably usable as a plate material for planography, which enables so-called direct plate formation in which a plate can be formed directly by scanning an infrared laser based on digital signals from a computer or the like.

2. Description of the Related Art

In recent years, high-output, compact solid-state lasers, semiconductor lasers, and gas lasers, which emit ultraviolet light, visible light, and infrared light having wavelengths ranging from 300 to 1200 nm, have become readily available. These lasers are very useful as a recording light source when a printing plate is formed directly based on digital data from a computer or the like.

Various studies of recording materials sensitive to these lasers have been made, and typical examples of photosensitive materials which can be recorded by an infrared laser beam having a wavelength of 760 nm or greater include the positive-type recording material described in U.S. Pat. No. 4,708,925, and the negative-type recording material which is crosslinkable by an acid catalyst and described in Japan Patent Application Laid-Open (JP-A) No. 8-276558.

As for recording materials sensitive to ultraviolet light or visible light lasers having wavelengths ranging from 300 to 700 nm, there are many negative-type recording materials and the like which are based on a radical polymerization such as those described in U.S. Pat. No. 2,850,445 and Japanese Patent Application Publication (JP-B) No. 44-20,189. Such materials utilizing a radical polymerization can achieve a high level of sensitivity. However, the sensitivity of a recording material based on a radical polymerization is generally significantly reduced due to the polymerization being inhibited by oxygen in the air. In order to prevent this problem, a layer impermeable to oxygen (i.e., a so-called overcoat layer represented by a polyvinyl alcohol layer or the like) is provided. However, there has been the concern that, when overcoat layer is provided, inhibition of polymerization by oxygen is prevented, thus resulting in deterioration of storage stability and fogging due to dark polymerization. In order to prevent this problem, normally a polymerization inhibitor is added so as to secure sensitivity and storage stability.

A material recordable by short-wave light or an electron beam having a wavelength of 300 nm or less, is important as a photoresist material in particular. In recent years the degree of integration in integrated circuits has increasingly risen, and even in the manufacture of semiconductor substrates such as ultra LSIs and the like, it has become necessary to form ultra-fine patterns having line widths of a half micron or less. In order to satisfy this need, wavelengths used in exposure apparatuses used for photolithography have become increasingly shorter. Far ultraviolet light and excimer light (XeCl, KrF, ArF, and the like) have come to be studied. Further, even ultra-fine patterning by an electron beam has come to be studied. In particular, electron beams are believed to be promising as light sources in next generation patterning technology.

A task common to all of these image forming materials has been how to intensify image ON-OFF in the portions irradiated and not irradiated, i.e., image portions and non-image portions, with the above-mentioned energies. In addition, there has been the problem that the adhesion of the portions irradiated with the above-mentioned energies to a support is weakened. In particular, when ultra-fine patterns are being written, the above-mentioned effects of raising sensitivity and increasing resolution are not sufficiently obtained if the adhesion of portions of the recording layer having very small surface areas to the support is weak. Since image forming materials satisfactorily free from these problems have not been obtained, a new technology different from conventional technologies has been sought.

SUMMARY OF THE INVENTION

The object of the present invention is to provide a negative-type image forming material which solves the above-mentioned problems. In particular, the object of the present invention is to provide a negative-type image forming material which can be engraved directly from digital data from a computer or the like by using a solid-state laser or a semiconductor laser which emits an infrared ray, produces clear images with clearly discernible ON-OFF, and has excellent storage stability and a negative-type image forming material which ensures good adhesion to a support and has excellent storage stability.

In focusing their attention upon the layer structure of image forming materials, the present inventors discovered that the above-mentioned problems can be solved by forming on a support a recording layer which utilizes radical-polymerizability and has excellent sensitivity, and a recording layer crosslinkable by an acid, and therefore devised the present invention.

Accordingly, an image forming material comprising:

(a) an acid-crosslinkable layer containing a first compound that generates an acid when subjected to at least one of light and heat, and a second compound crosslinkable by said acid, the second compound having an alkali solubility which is lowered when crosslinked with said acid;

(b) a radical-polymerizable layer, containing one compound that generates a radical when subjected to at least one of light and heat and another compound capable of undergoing a radical polymerization and whose alkali solubility is lowered by said radical polymerization, and (c) a support on which at least one of the layers is disposed, with the other layer being disposed on said at least one of the layers.

Preferably, the image forming material contains an infrared absorbent from the standpoint of raising sensitivity. The infrared absorbent may be contained in any one of the radical-polymerizable layer and the acid-crosslinkable layer or in both of them. Alternatively, the infrared absorbent may be contained in another layer provided in a position adjacent to the foregoing layers.

In the present invention, "provided with respective layers in an order" denotes that the radical-polymerizable layer and the oxygen-transmission controlling layer are provided on a support in the order listed in the passage. It should be noted, however, that the presence of other auxiliary layers, such as an intermediate layer, a protective layer, an undercoat layer, or the like, is not excluded by the description.

The mechanism resulting in the working of the present invention is not altogether clear. However, the mechanism is believed to be as follows. In the image forming material of the first aspect of the present invention, by first providing on a support an acid-crosslinkable layer and then using a radical-polymerizable layer on top of the acid-crosslinkable layer, a hardening of the film occurs due to radical polymerization whereby a raising of the sensitivity is achieved in the upper layers of the exposed portions. Next, an acid-catalyzed hardening having excellent adhesion occurs in the lower layers of the exposed portions. Further, because an acid crosslinkable layer which has innate high storage stability is used as the lower layer, the adhesiveness of the recording layer in the exposed portions can be improved while preserving the high sensitivity of the radical polymerization. In addition, the storage stability of the recording layer itself is also improved.

Therefore, when the image forming material of the present invention is used in a printing plate such as a planographic plate, problematic defects associated with recording layers of a radical polymerization type, such as insufficient adhesion due to volume contraction at the time of polymerization, and omissions of portions of an image (particularly small dots) at the time of printing, shortening of plate life due to this insufficient adhesion, can be effectively prevented. When the image forming material of the present invention is used as a resist, defects such as pattern omissions in dry etching at the time small dots and isolated patterns can be effectively prevented.

In the image forming material of the second aspect of the present invention, it is thought that by providing an acid-crosslinkable layer, which acts as a layer to control oxygen transmission, on top of the radical -polymerizable layer, a hardening of the film occurs in the exposed portions whereby the transmission of oxygen is largely inhibited in the upper layer of the exposed portions. Next, in the lower layer of the exposed portions, because the polymerization of the generated radicals is not inhibited by oxygen, a radical polymerization reaction progresses efficiently and a hardening of the film occurs, whereby sensitivity is raised. Similarly, in unexposed portions, since oxygen transmission is maintained in the upper layer, dark polymerization, which is undesirable in the radical-polymerizable layer, becomes difficult to occur and therefore the unexposed portions can be easily removed at the time when development processing is carried out. As a result, improving basic ON-OFF of images becomes possible.

On the other hand, while the image forming material is stored, since the film of the oxygen-transmission controlling layer is not yet hardened, the oxygen, which is transmitted through the layer, causes polymerization inhibition in the radical-polymerizable layer and significantly diminishes the dark polymerization so that storage stability is improved. That is, it is believed that, by controlling oxygen transmission basic ON-OFF of images can be improved, and raising sensitivity and storage stability are achieved.

In the present invention, it should be noted that the acid-crosslinkable system which crosslinks and hardens by the use of an acid as a catalyst includes a cationic polymerization system which does not involve volume contraction at the time of polymerization.

DESCRIPTION OF THE PREFERRED EMBODIMENTS

The image forming material of the first aspect of the present invention is provided with a support having in an order thereon an acid-crosslinkable layer and a radical-polymerizable layer in the vicinity of the surface to be exposed to light. The image forming material of the second aspect of the present invention is provided with a support having in an order thereon a radical-polymerizable layer and an acid-crosslinkable layer in the vicinity of the surface to be exposed to light. Details of the structure of the image forming materials of the present invention are given below.

The radical-polymerizable layer in the image forming material of the present invention contains a compound that generates radicals by light or heat (this compound is hereinafter referred to as a radical generator) and a compound capable of undergoing radical polymerization (this compound is hereinafter referred to as a polymerizable compound). For example, a radical is generated from the radical generator in the exposed portions due to irradiation of an infrared laser or the like and the radical acts as an initiator for the polymerizable compound to harden due to a radical polymerization reaction so that image portions are produced. The combination of the radical generator and the polymerizable compound for use in the present invention may be appropriately selected from conventionally known combinations in so far as the strength of the film produced by the radical polymerization meets the requirements for the image forming material. In addition, in order to enhance the reactivity of the radical generator, an accelerator such as an onium salt, an infrared absorbent, or the like may be used together. Preferable components usable in the radical-polymerizable layer also include, for example, the compounds listed as structural components of a thermally polymerizable recording layer described in JP-A No. 8-108621, and the compounds listed as structural components of a photosensitive layer described in JP-A No. 9-34110.

Radical Generators

Known radical polymerization initiators that are commonly used for polymer synthesis reactions by radical polymerization can be used without particular limitations as the radical generators for use in the radical-polymerizable layer. Examples of the radical generators include azobisnitrile compounds such as 2,2'-azobisisobutyronitrile and 2,2'-azobispropionitrile, organic peroxides such as benzoyl peroxide, lauroyl peroxide, acetyl peroxide, t-butyl perbenzoate, α-cumyl hydroperoxide, di-t-butyl peroxide, diisopropylperoxy dicarbonate, t-butylperoxyisopropyl carbonate, peroxy acids, alkylperoxy carbamates, and nitrosoarylacylamines, inorganic peroxides such as potassium persulfate, ammonium persulfate, and potassium perchlorate, azo or diazo compounds such as diazo aminobenzene, p-nitrobenzene diazonium, azobis-substituted alkanes, diazo thioethers, and arylazo sulfones, nitrosophenylurea, tetraalkylthiuram disulfides such as tetramethylthiuram disulfides, diaryl disulfides such as dibenzoyl disulfide, dialkylxanthogenic acid disulfide, arylsulfinic acids, arylalkylsulfonic acids, 1-alkanesulfinic acids, and so on.

When the image recording layer of the present invention is recorded by an infrared laser, sufficient sensitivity can be obtained even if a radical generator whose activation energy is large is used because the temperature of the surface exposed to light reaches as high as 600° C. or above, although the temperature depends on the energies of the lasers.

Examples of radical generators whose activation energy is preferably 30 Kcal/mol or more include azobisnitrile compounds and organic peroxides. Among them, preferred are compounds which have excellent stability at room temperature, exhibit a high decomposition rate when heated, and become colorless when decomposed. Examples of these compounds include benzoyl peroxide, 2,2'-azobisisobutyronitrile, and the like.

The radical generators may be used singly or in combinations of two or more types. The radical generators are used in an amount of 0.5–30% by weight, preferably 2–10% by weight, based on the total weight of the solid components of the radical-polymerizable layer.

In addition, a compound that generates a radical by the interaction with an onium salt, which is described later, can also be suitably used. Specific examples of the compound include halides (e.g., α-haloacetophenones, trichloromethyltriazines, and the like), azo compounds, aromatic carbonyl compounds (e.g., benzoin esters, ketals, acetophenones, o-acyloxyiminoketones, acylphosphine oxides, and the like), hexaarylbisimidazole compounds, peroxides, and soon. Preferred among these compounds are the bisimidazole compounds disclosed as (A-1) to (A-4) on page 16 of JP-A No. 9-34110.

The latter type of the radical generators enables the raising of sensitivity by the interaction with an onium salt. Examples of the onium salt that can be used in combination with the radical generator include the phosphonium salts, sulfonium salts, iodonium salts, and ammonium salts described in paragraphs [0022] to [0049] of JP-A No. 9-34110.

The amount of the onium salt to be added is 0.05–50% by weight based on the total weight of the solid components of the image forming material, although the amount varies with the species and states of the onium salt in use.

Polymerizable Compounds

Known monomers having a polymerizable group may be used without particular limitation as the polymerizable polymeric compounds that polymerize and harden by the radical to be generated from the radical generator. Specific examples of such monomers include monofunctional acrylate esters, such as 2-ethylhexyl acrylate, 2-hydroxyethyl acrylate, and 2-hydroxypropyl acrylate, derivatives thereof, and compounds in which the acrylate is replaced by methacrylate, itaconate, crotonate, maleate, or the like; difunctional acrylate esters, such as polyethylene glycol diacrylate, pentaerythritol dimethacrylate, bisphenol A diacrylate, and diacrylate of ϵ-caprolactam addition product of neopentyl glycol hydroxypivalate, derivatives thereof, and compounds in which the acrylate is replaced by methacrylate, itaconate, crotonate, maleate, or the like; and polyfunctional acrylate esters, such as trimethylolpropane tri(meth)acrylate, dipentaerythritol pentaacrylate, dipentaerythritol hexaacrylate, and pyrogallol triacrylate, derivatives thereof, and compounds in which the acrylate is replaced by methacrylate, itaconate, crotonate, maleate, or the like. Also suitably used is a so-called prepolymer which is prepared by introducing acrylic acid or methacrylic acid into an oligomer having a proper molecular weight so that the photopolymerizable property is imparted.

Other examples include the compounds described in JP-A Nos. 58-212994; 61-6649; 62-46688; 62-48589; 62-173295; 62-187092; 63-67189; and 1-244891. In addition, the compounds described in "11290 Chemical Products", Kagaku Kogyo Nippon Co., Ltd., pp.286–289, and the compounds described in "UV/EB Curing Handbook (materials)", Koubunshi Kankoukai, pp. 11–65, can be suitably used.

Among these compounds, compounds which have in the molecule thereof two or more acryl or methacryl groups are preferable in the present invention. These compounds have a molecular weight of 10,000 or less and more preferably 5,000 or less. A single polymerizable compound or a combination of two or more species of the polymerizable compounds, with the proviso that the compatibility or affinity therebetween presents no problem, may be selected in accordance with the object for use in the present invention from the monomers and prepolymers, each having a polymerizable group, including those previously illustrated.

A compound having an ethylenically unsaturated group is incorporated in the radical-polymerizable layer in an amount of preferably 20–80% by weight, more preferably 30–60% by weight, based on the total weight of the solid components of the radical-polymerizable layer.

Binder Resins

If necessary, a binder resin may be used in the photosensitive layer. Examples of the binder resin include polyester resins, polyvinyl acetal resins, polyurethane resins, polyamide resins, cellulosic resins, olefinic resins, polyvinyl chloride resins, (meth)acrylic resins, styrenic resins, polycarbonate, polyvinyl alcohol, polyvinylpyrrolidone, polysulfone, polycaprolacton resins, polyacrylonitrile resins, urea resins, epoxy resins, phenoxy resins, rubber-based resins, and so on. In addition, a resin which has in the molecule thereof an unsaturated bond, for example a diallyl phthalate resin or a derivative thereof, or chlorinated polypropylene, can be polymerized with the above-described compound having an ethylenically unsaturated group and therefore can be suitably used in accordance with applications. Resins selected from the above-listed resins may be used singly or in combinations as a binder resin.

The amount of the binder resin to be used is preferably within a range of 500 parts by weight or less, more preferably 200 parts by weight or less, based on 100 parts by weight of the polymerizable compound.

Infrared Absorbents

In the present invention, in order to raise the sensitivity of the radical generator and accelerate the radical polymerization, the radical-polymerizable layer preferably contains an infrared absorbent which efficiently converts the light of an infrared laser into heat. The infrared absorbents used in the present invention is a dye or pigment which effectively absorbs infrared rays having wavelengths ranging from 760 nm to 1200 nm. It is preferable that the dye or pigment has an absorption peak at a wavelength between 760 nm and 1200 nm.

As to dyes, commercially available dyes and known dyes described in, for example, "Senryo Binran" (Dye Handbook) (edited by The Society of Synthetic Organic Chemistry, Japan, 1970), may be used. Specifically, examples of such dyes include azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium dyes, and metal thiolate complexes.

Examples of preferable dyes include cyanine dyes described in, for example, JP-A Nos. 58-125246, 59-84356, 59-202829, and 60-78787; methine dyes described in, for example, JPA Nos. 58-173696, 58-181690, and 58-194595; naphthoquinone dyes described in, for example, JP-A Nos. 58-112793, 58-224793, 59-48187, 59-73996, 60-52940, and 60-63744; squarylium dyes described in, for example, JP-A No. 58-112792; and cyanine dyes described in, for example, U.K. Patent No. 434,875.

Near-infrared-absorbing sensitizers described in U.S. Pat. No. 5,156,938 are also suitably used. In addition, the following compounds are also preferred: substituted arylbenzo (thio)pyrylium salts disclosed in U.S. Pat. No. 3,881,924; trimethinethiapyrylium salts described in JP-A No. 57-142645 (U.S. Pat. No. 4,327,169); pyrylium compounds described in JP-A Nos. 58-181051, 58-220143, 59-41363, 59-84248, 59-84249, 59-146063, and 59-146061; cyanine dyes described in JP-A No. 59-216146; pentamethinethiopyrylium salts described in U.S. Pat. No. 4,283,475; and pyrylium compounds disclosed in JP-B Nos. 5-13514 and 5-19702.

Other dyes that are described in U.S. Pat. No. 4,756,993 as near-infrared-absorbing dyes represented by the formulas (I) or (II) may also be suitably used.

Among these dyes, particularly preferred are cyanine dyes, squarylium dyes, pyrylium dyes, and nickel thiolate complexes.

Preferred examples of the infrared absorbent that can be used in the present invention include infrared absorbents having an onium salt structure as shown below. The use of such an infrared absorbent makes it possible to omit the addition of the above-mentioned onium salt or to reduce the amount of the onium salt to be added. Specific examples (A-1 to A-56) of the infrared absorbents having the onium salt structure are given below. It should be noted, however, that the present invention is not limited to these examples.

A-1)

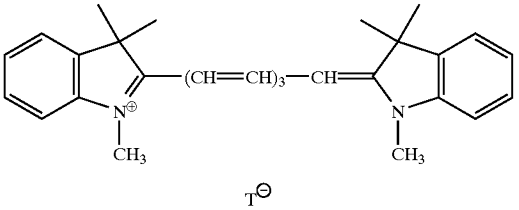

A-2)

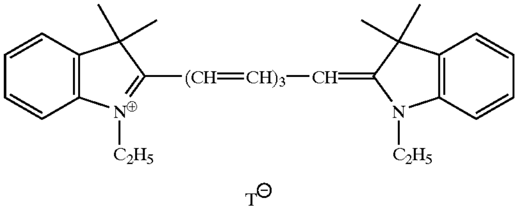

A-3)

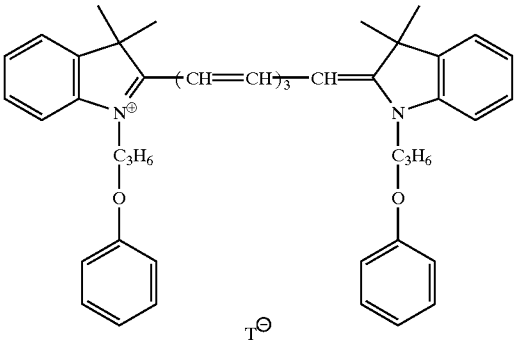

A-4)

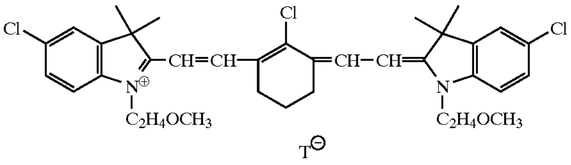

A-5)

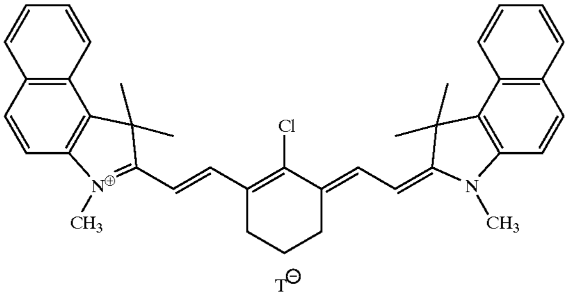

A-6)

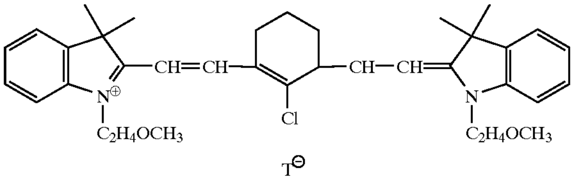

A-7)

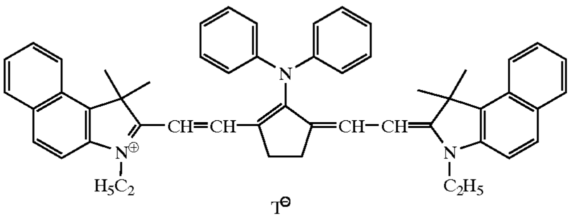

A-8)

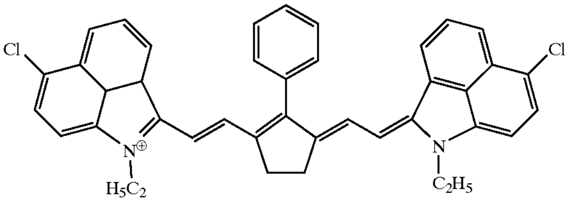

-continued
A-9)
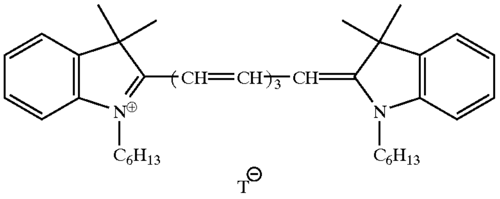
A-10)
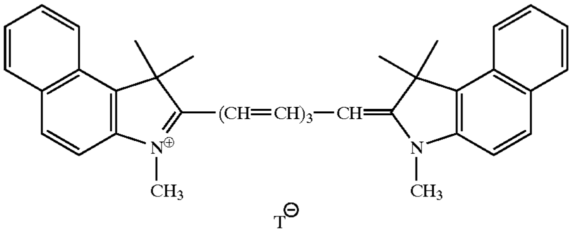
A-11)
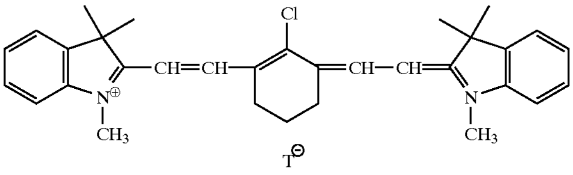
A-12)
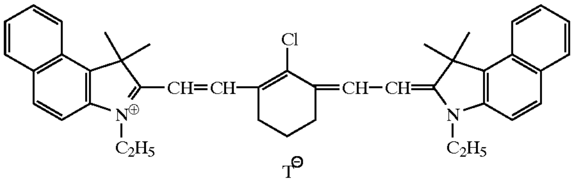
A-13)
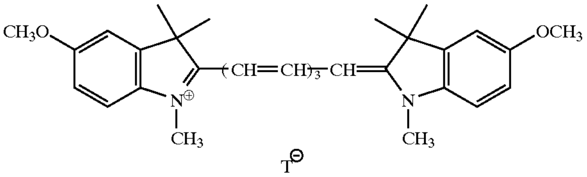
A-14)
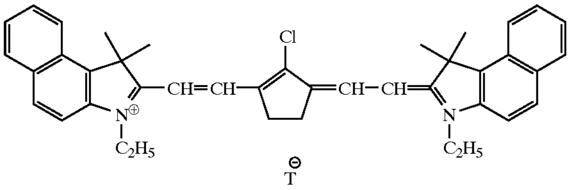
A-15)
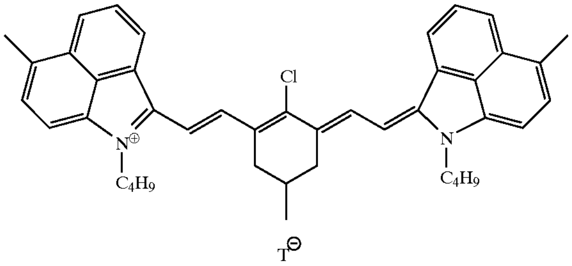
A-16)
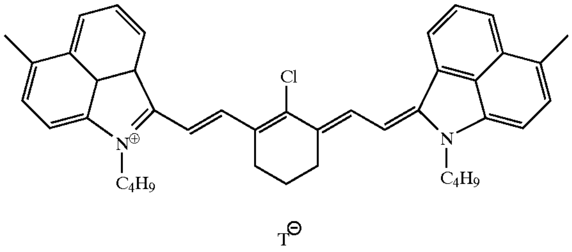
A-17)
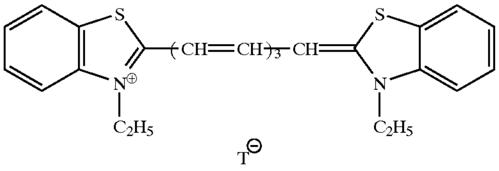
A-18)
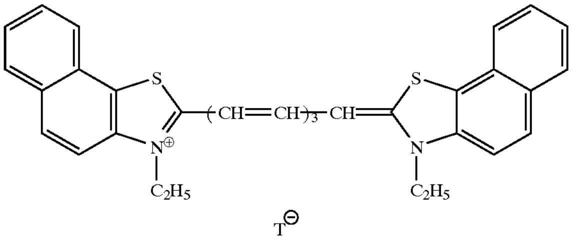
A-19)
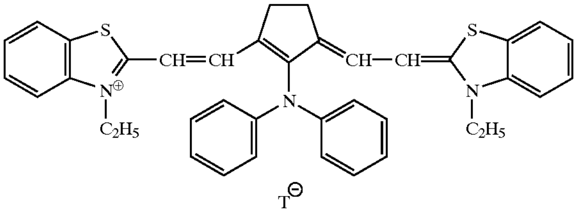
A-20)
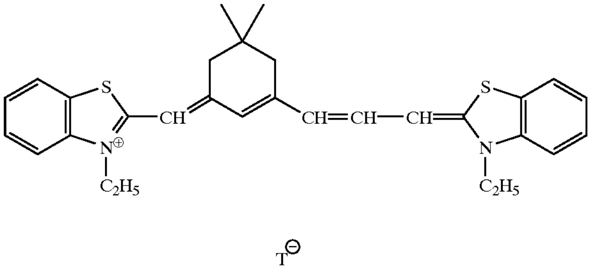
A-21)

In the above-described structural formulae A-1 to A-56, $T^-$ represents a monovalent counter anion, preferably, a halogen anion ($F^-$, $C^-$, $Br^-$, $I^-$), a Lewis acid anion ($BF_4^-$, $PF_6^-$, $SbCl_6^-$, $ClO_4^-$) an alkylsulfonic acid anion, or an arylsulfonic acid anion.

Herein, "alkyl" means a straight-chain, branched, or cyclic alkyl group having 1 to 20 carbon atoms, and specific examples thereof include a methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, 2-methylhexyl group, cyclohexyl group, cyclopentyl group, and 2-norbornyl group. Among these, straight-chain alkyl groups having 1 to 12 carbon atoms, branched alkyl groups having 3 to 12 carbon atoms, and cyclic alkyl groups having 5 to 10 carbon atoms are more preferable.

Herein, "aryl" refers to an aryl which is formed by one benzene ring, an aryl in which 2 or 3 benzene rings form a condensed ring, or an aryl in which a benzene ring and 5-member unsaturated ring form a condensed ring, and specific examples thereof include a phenyl group, naphthyl group, anthryl group, phenanthryl group, indenyl group, acenaphthenyl group, and fluorenyl group. Among these, a phenyl group and a naphthyl group are more preferable.

Pigments that may be used in the present invention are commercially available pigments and pigments described in "Color Index (CI) Handbook", "Saishin Ganryo Binran" (Current Pigment Handbook) (edited by Nihon Ganryo Gijutsu Kyokai, 1977), "Saishin Ganryo Oyo Gijutsu" (Current Pigment Application Technology) (published by CMC Shuppan, 1986), and "Insatsu Inki Gijutsu" (Printing Ink Technology) (published by CMC Shuppan, 1984).

Examples of the kinds of pigments that may be used include black pigments, yellow pigments, orange pigments, brown pigments, red pigments, purple pigments, blue pigments, green pigments, fluorescent pigments, metal powder pigments, and other pigments such as polymer-linked dyes. Specifically, there may be used insoluble azo pigments, azo lake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, and carbon black. Among these pigments, carbon black is preferred.

These pigments may be used without being surface-treated, or may be used after being surface-treated. Examples of the surface treatment methods include surface coating with a resin or a wax, depositing a surfactant, and binding a reactive substance (such as a silane coupling agent, an epoxy compound, a polyisocyanate, or the like) to pigment surfaces. These surface treatment methods are described in "Kinzoku-sekken no Seishitsu to Oyo" (Properties of Metallic Soaps and their Applications) (Sachi Shobo), "Insatsu Inki Gijutsu" (Printing Ink Technology) (published by CMC Shuppan, 1984), and "Saishin Ganryo Oyo Gijutsu" (Current Pigment Application Technology) (published by CMC Shuppan, 1986).

The particle size of the pigments preferably falls within the range of 0.01–10 $\mu$m, more preferably 0.05–1 $\mu$m, and particularly preferably 0.1–1 $\mu$m. Particle sizes of less than 0.01 $\mu$m are not desirable from the point of the stability of dispersed in the coating liquids for the acid-crosslinkable layer and the radical-polymerizable layer, whereas particle sizes of greater than 10 $\mu$m are not desirable from the point of the uniformity of the recording layer.

Known dispersion techniques used in the manufacture of ink and toners can be used as a method for dispersing the pigment. Dispersers include an ultrasonic disperser, a sand mill, an attritor, a pearl mill, a super mill, a ball mill, an impeller, a disperser, a KD mill, a colloid mill, a dynatron, a three-roll mill, and a pressurized kneader. Details thereof are described in "Saishin Ganryo Oyo Gijutsu" (Current Pigment Application Technology) (published by CMC Shuppan, 1986).

Besides the above-described compounds, also usable are the compound described as "light-to-heat converting substance" in JP-A No. 8-108621, the compound described as "light-to-heat converting element" in JP-A No. 9-34110, and the like.

These dyes or pigments may be added to the image recording layer in an amount of 0.01–50% by weight, preferably 0.1–10% by weight, particularly preferably 0.5–10% by weight in the case of dyes, and particularly preferably 1.0–10% by weight in the case of pigments based on the total weight of the solid components of the radical-polymerizable layer. If the amount of the pigment or dye is less than 0.01% by weight, effect of raising sensitization is insufficient, whereas if it is more than 50% by weight, stains are undesirably generated at non-image background portions during printing.

Other Compounds

The radical-polymerizable layer may contain conventionally known additives, which are used together with photopolymerizable compounds, in so far as the effects of the present invention are not impaired.

An example of the additives is a thermal polymerization inhibitor. Specific examples of the thermal polymerization inhibitor include quinone and phenolic compounds such as hydroquinone, pyrogallol, p-methoxyphenol, catechol, β-naphthol, 2,6-di-t-butyl-p-cresol, and the like. These additives are used in an amount of less than 10 parts by weight, preferably about 0.01–5 parts by weight, per 100 parts by weight of the total of the polymerizable compound having an ethylenically unsaturated bond and the binder resin.

Examples of compounds that may be added as an oxygen quencher include N,N-dialkylaniline derivatives such as the compounds described in column 11, line 58, through column 12, line 35, in U.S. Pat. No. 4,772,541.

In addition, a plasticizer may be used in order to improve film properties. Examples of the plasticizer include phthalic acid esters, trimellitic acid esters, adipic acid esters, saturated or unsaturated carboxylic acid esters, citric acid esters, epoxidized soybean oil, epoxidized linseed oil, stearic acid epoxides, phosphoric acid esters, phosphorous acid esters, glycol esters, and so on.

An acid-generating agent is also preferably used together as an additive which, when heated, generates an acid and thus accelerates the decomposition of the radical generator. The acid-generating agents that can be used are described in detail in the following explanation of the acid-crosslinkable layer.

The above-described components, which are appropriately selected, are dissolved in a suitable solvent and the resulting solution is coated on a support so as to form a radical-polymerizable layer. The coating weight after drying is preferably 0.01–5.0 g/cm$^2$.

When an infrared absorbent is added to the radical-polymerizable layer, the infrared absorbent is added such that the optical density at the recording wavelength falls within the range of 0.5–3. Further, the radical generator, polymerizable compound, infrared absorbent that is optionally used together, and the like may be enclosed in microcapsules so as to raise sensitivity. Preferably, the microcapsules to be used in the present invention have a heat-responsive property (i.e., are microcapsules from which are released the enclosed substance when heated by exposure to light) . Details of the method for forming such microcapsules are described in JP-A No. 1-145190.

In order to prevent polymerization inhibition due to oxygen, an overcoat layer impermeable to oxygen may be disposed in a position adjacent to the radical-polymerizable layer. Examples of the overcoat layer material include preferably a water-soluble resin such as polyvinyl alcohol, carboxymethyl cellulose, hydroxyethyl cellulose, methyl cellulose, polyvinylpyrrolidone, or the like. The proper thickness of the layer is about 0.2–3 $\mu$m.

The oxygen-transmission controlling layer of the image forming material (b) of the present invention is not particularly limited in so far as the oxygen-transmission controlling layer is structured such that its oxygen transmission is reduced by light or heat. That is to say, it is structured such that it has a proper level of oxygen transmission while it is not affected by light or heat but it undergoes some transformation by light or heat so that its oxygen transmission is reduced. Material which can be suitably selected and used include, for example, a combination of an initiator and a polymerizable or crosslinkable compound capable of hardening and forming a film by the action of light or heat, or a material which hardens directly by the action of light or heat. Among these, it is preferable to select as the oxygen-transmission controlling layer the acid-crosslinkable layer, described in detail below, which itself is an image forming material capable of forming a negative-type image by the action of light or heat.

Acid-crosslinkable Layers

The acid-crosslinkable layer preferably usable as an oxygen-transmission controlling layer in the present invention contains a compound that generates an acid by the action of light or heat (this compound is hereinafter referred to as an acid-generating agent), a compound that can crosslink by the catalytic action of the acid generated (this compound is hereinafter referred to as a crosslinking agent), and a binder polymer that can react with the crosslinking agent in the presence of the acid to form a layer containing the foregoing compounds. In the acid-crosslinkable layer, light irradiation or heating decomposes the acid-generating agent and causes the agent to generate an acid which accelerates the activity of the crosslinking agent. Consequently, a strong crosslinked structure is formed between the crosslinking agents themselves or between the crosslinking agent and the binder polymer, which structure significantly reduces the oxygen transmission and lessens the alkali solubility of the film itself so that the layer becomes insoluble in a developing solution.

As to the acid-crosslinkable layer that has the above-described characteristics, a known layer having similar characteristics can be used. An example of the layer is the layer composed of a radiation-sensitive composition described in JP-A No. 7-20629 which contains aresol resin, a novolak resin, a latent Bronsted acid, and an infrared absorbent. This composition contains both of a resol resin which has alkali resistance and a novolak resin which has high alkali solubility and, in addition, a latent Bronsted acid. The term “a latent Bronsted acid” as used herein means a precursor which, when decomposed, produces a Bronsted acid and which is a compound having the characteristics of both of the acid-generating agent and the acid-crosslinking agent in the present invention. The Bronsted acid is believed to catalyze a matrix forming reaction between the resol resin and the novolak resin. Examples of the Bronsted acid suitable to this purpose include trifluoromethanesulfonic acid and hexafluorophosphonic acid.

In addition, an ionic latent Bronsted acid is preferred. Examples include onium salts, particularly iodonium salts, sulfonium salts, phosphonium salts, selenonium salts, diazonium salts, and arsonium salts. Specific examples of particularly useful onium salts include diphenyliodonium hexafluorophosphate, triphenylsulfonium hexafluoroantimonate, phenylmethyl-ortho-cyanobenzylsulfonium trifluoromethanesulfonate, and 2-methoxy-4-aminophenyldiazonium hexafluorophosphonate.

A nonionic latent Bronsted acid can also be suitably used. Examples of such acid include the following compounds: $RCH_2X$, $RCHX_2$, $RCX_3$, $R(CH_2X)_2$, and $R(CH_2X)_3$ (where X is Cl, Br, F, $CF_3$, or $SO_3$; and R is an aromatic group, an aliphatic group, or a group consisting of a combination of an aromatic group and an aliphatic group).

In addition, the image forming material described in JP-A No. 11-95415, which contains an acid-crosslinkable compound and a high-molecular-weight binder, is also suitable. The photosensitive layer of this material contains a compound, which, when irradiated with an active radiation, can generate an acid. Examples of the compound include a salt, such as a diazonium, a phosphonium, a sulfonium, an iodonium, or the like, an organohalogen compound, an ortho-quinone-diazide sulfonylchloride, and an organometal/organohalogen compound together with a compound which has at least two bonds capable of crosslinking in the presence of the above-mentioned acid and which is exemplified by the following: an amino compound having as a functional group at least two of such groups as an alkoxymethyl group, a methylol group, an acetoxymethyl group, and the like, an aromatic compound, which is at least di-substituted and has as a functional group an alkoxymethyl group, a methylol group, an acetoxymethyl group, and the like, a resol resin, a furan resin, an acrylic resin synthesized from a specific monomer, and the like.

Other known recording materials that can be used as recording layers having similar functions include the negative-type image forming material described in JP-A No. 8-276558 which contains a phenol derivative, the negative-type image forming material described in JP-A No. 7-306528 which contains a diazonium compound, and the negative-type image forming material described in JP-A No. 10-203037 which utilizes an acid-catalyzed crosslinking reaction using a polymer having a heterocyclic group having an unsaturated bond in the ring. These recording layers can be used as the acid-crosslinkable layer of the present invention.

The acid-crosslinkable layer of the present invention contains an acid-generating agent, a crosslinking agent, a binder polymer, and others. These compounds are described below, respectively.

Acid-generating Agents

In the present invention, a compound that generates an acid by light or heat (i.e., an acid-generating agent) denotes a compound which is decomposed by infrared irradiation or by being heated to a temperature of 100° C. or higher thereby generating an acid. The acid to be generated is preferably a strong acid having a pKa of 2 or less such as sulfonic acid and hydrochloric acid.

Onium salts such as iodonium salts, sulfonium salts, phosphonium salts, and diazonium salts are some examples of the acid-generating agents preferably used in the present invention. Specifically, the compounds described in U.S. Pat. No. 4,708,925 and JP-A No. 7-20629 may be used. Particularly, iodonium salts, sulfonium salts, and diazonium salts—all of which contain a sulfonate ion as a counter ion—are preferred. As to the diazonium salts, the diazonium compound described in U.S. Pat. No. 3,867,147, the diazonium compound described in U.S. Pat. No. 2,632,703, and diazo resins described in JP-A Nos. 1-102456 and 1-102457 are also preferable. Examples of other preferable acid-generating agents include benzyl sulfonates described in U.S. Pat. Nos. 5,135,838 and 5,200,544; active sulfonate esters and disulfonyl compounds described in JP-A Nos. 2-100054 and 2-100055 and Japanese Patent Application No. 8-9444; and haloalkyl-substituted S-triazines described in JP-A No. 7-271029.

These acid-generating agents are added to the acid-crosslinkable layer in an amount of 0.01–50% by weight, preferably 0.1–40% by weight, and more preferably 0.5–30% by weight based on the total weight of the solid components of the acid-crosslinkable layer. If the amount of the acid-generating agent is less than 0.01% by weight, images cannot be obtained, whereas if it is more than 50% by weight, stains are undesirably generated at non-image portions during printing.

These compounds may be used singly or in combinations of two or more species. Since the above-listed acid-generating agents can also be decomposed by ultraviolet irradiation, the image forming material of the present invention can be recorded not only by infrared irradiation but also by ultraviolet irradiation.

Acid-crosslinking Agents

The crosslinking agent which can be used in the acid-crosslinkable layer of the present invention is not particularly limited in so far as the crosslinking agent is a compound which crosslinks by an acid. Preferred examples of the crosslinking agent include phenol derivatives represented by the following general formula (I) (these derivatives are hereinafter referred to as low-molecular-weight phenol derivatives), polynuclear phenolic crosslinking agents represented by the following general formula (II) and having in the molecule thereof 3 or more phenol rings each having 2 or 3 hydroxymethyl groups on the ring, mixtures of the low-molecular-weight phenol derivative and the polynuclear phenolic crosslinking agent and/or a resol resin.

General formula (I)

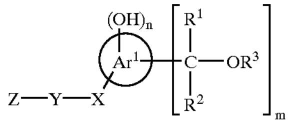

Y:

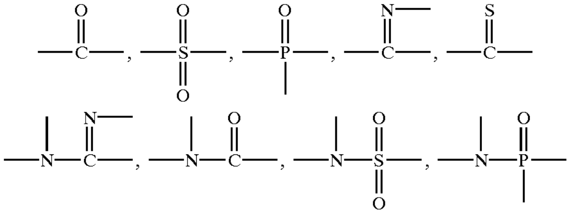

-continued

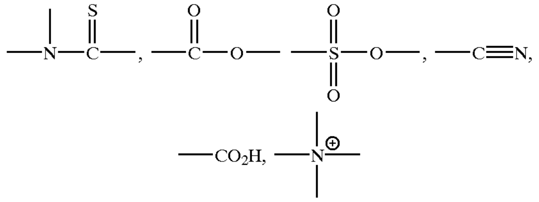

In the formula, $Ar^1$ represents an aromatic hydrocarbon ring which may have a substituent. $R^1$ and $R^2$ maybe the same or different and represent, respectively, a hydrogen atom or a hydrocarbon group having 12 or fewer carbon atoms. $R^3$ represents a hydrogen atom or a hydrocarbon group having 12 or less carbon atoms. m represents an integer of 2 to 4. n represents an integer of 1 to 3. X represents a bivalent linking group; Y represents a mono- to quadrivalent linking group having the above-mentioned partial structure or a functional group endstopped with a hydrogen atom; Z is absent if Y is a terminal group or represents a mono- to quadrivalent linking or functional group which is present in accordance with the number of the linking group Y.

General formula (II)

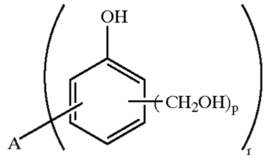

In the formula, A represents a hydrocarbon linking group having a valency of r; and r represents an integer of 3 to 20. p represents an integer of 2 to 3.

First, details of the phenol derivative represented by the general formula (I) are given below.

In the general formula (I), $Ar^1$ represents an aromatic hydrocarbon ring which may have a substituent. From the standpoint of the availability of raw materials, the aromatic hydrocarbon ring is preferably a benzene ring, a naphthalene ring, or an anthracene ring. Preferred examples of the substituent include a halogen atom, a hydrocarbon group having 12 or less carbon atoms, an alkoxy group having 12 or fewer carbon atoms, an alkylthio group having 12 or fewer carbon atoms, a cyano group, a nitro group, a trifluoromethyl group, and so on. From the standpoint of high sensitivity, $Ar^1$ is particularly preferably a benzene or naphthalene ring having no substituent, or a benzene or naphthalene ring having as a substituent a halogen atom, a hydrocarbon group having 6 or fewer carbon atoms, an alkoxy group having 6 or fewer carbon atoms, an alkylthio group having 6 or fewer carbon atoms, a cyano group, or the like.

$R^1$ and $R^2$ may be the same or different and represent, respectively, a hydrogen atom or a hydrocarbon group having 12 or fewer carbon atoms. From the standpoint of ease in synthesis, particularly preferably $R^1$ and $R^2$ are, respectively, a hydrogen atom or a methyl group. $R^3$ represents a hydrogen atom or a hydrocarbon group having 12 or fewer carbon atoms. From the standpoint of high sensitivity, $R^3$ is particularly preferably, for example, a hydrocarbon group having 7 or fewer carbon atoms such as a methyl, ethyl, propyl, cyclohexyl, or benzyl group. m represents an integer of 2 to 4. n represents an integer of 1 to 3.

X represents a bivalent linking group; Y represents a mono- to quadrivalent linking group having the above-mentioned partial structure or a functional group having a hydrogen atom as a terminal; Z is absent if Y is a terminal group or represents a mono- to quadrivalent linking or functional group which is present in accordance with the number of the linking groups Y.

Next, details of X in the general formula (I) are given below.

X is a bivalent linking group and represents a single bond or a hydrocarbon linking group which may have a substituent. Preferred examples of the hydrocarbon linking group include a straight-chain alkylene, branched alkylene, or cyclic alkylene group having 1 to 18 carbon atoms, a straight-chain alkenylene, branched alkenylene, or cyclic alkenylene group having 2 to 18 carbon atoms, an alkynylene group having 2 to 8 carbon atoms, and an arylene group having 6 to 20 carbon atoms. Specifically, more preferred examples of the group include methylene, ethylene, propylene, butylene, isobutylene, cyclohexylene, phenylene, tolylene, biphenylene, and the group represented by the following structure.

—CH=CH—, —CH=CH—CH=CH—,

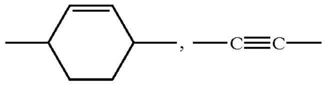

If these linking groups have a substituent, preferred examples of the substituent include an alkoxy group having 12 or less carbon atoms, a halogen atom, and a hydroxyl group.

Next, details of Y in the general formula (I) are given below.

Y is functional group that may be a linking group accompanied by Z which is described later. As shown previously, Y may be monovalent, bivalent, trivalent, or quadrivalent and is a group known to have a strong interaction with a phenolic hydroxyl group. Specifically, preferred examples of Y include functional groups having the following partial structures.

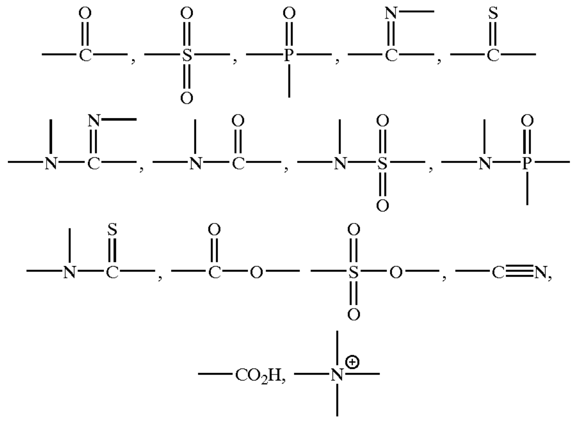

In the above explanation, what is meant by any of the above-listed structures is a partial structure of Y is that the functional group Y, which is a linking group or a group having a hydrogen atom as a terminal, has at least one of the above-listed partial structures. Accordingly, Y includes a group composed of a plurality of the above-listed partial structures which are connected together, a group composed of any of the above-listed partial structures connected to an ordinary group such as a hydrocarbon group, and so on.

In particular, specific examples of more preferred compounds having these functional groups include amides, sulfonamides, imides, ureas, urethanes, thioureas, carboxylic acids, carboxylate esters, sulfonate esters, and so on.

Next, details of Z in the general formula (I) are given below.

Z is absent if Y is a terminal group, or Z represents a mono- to quadrivalent linking or functional group which is present in accordance with the number of the linking group Y. Z is preferably a hydrocarbon linking group or a group, which may have a substituent respectively. Preferred examples of the hydrocarbon linking group include a straight-chain alkylene or alkyl group, a branched alkylene or alkyl group, cyclic alkylene or alkyl group, which have 1 to 18 carbon atoms respectively, an arylene or aryl group having 6 to 20 carbon atoms, a straight-chain, branched, or cyclic alkenylene or alkenyl group having 2 to 18 carbon atoms, an alkynylene or alkynyl group having 2 to 18 carbon atoms.

If Z is monovalent, more preferred examples of Z include methyl, ethyl, propyl isopropyl, butyl, isobutyl, tertiarybutyl, secondary butyl, pentyl, hexyl, cyclopentyl, cyclohexyl, octyl, benzyl, phenyl, naphthyl, anthracenyl, allyl, vinyl, and the like.

If Z is bivalent or of a higher valency, preferred examples of Z are linking groups formed by eliminating hydrogen atoms in a number corresponding to the valency from the above-listed groups.

If Z has a substituent, preferred examples of the substituent include an alkoxy group having 12 or fewer carbon atoms, a halogen atom, and a hydroxyl group.

For the convenience of explanation, specific examples of the low-molecular-weight phenol derivatives suitably used in the present invention are divided into, but not limited to, several patterns, for example, in terms of functional groups illustrated below.

TABLE 1

(Type A)

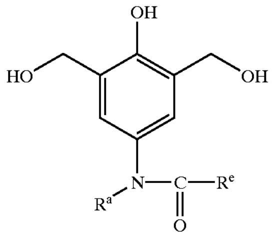

| | $R^a$ | $R^e$ |
|---|---|---|
| (A-1) | R | H |
| (A-2) | H | $CH_3$ |
| (A-3) | H | $C_2H_5$ |
| (A-4) | H | $^iPr$ |
| (A-5) | H | $^iBu$ |
| (A-6) | H | Ph |
| (A-7) | $CH_3$ | $CH_3$ |
| (A-8) | $CH_3$ | $^iPr$ |
| (A-9) | $CH_3$ | Ph |
| (A-10) | Ph | $CH_3$ |
| (A-11) | Ph | $^iPr$ |

TABLE 2

(Type B)

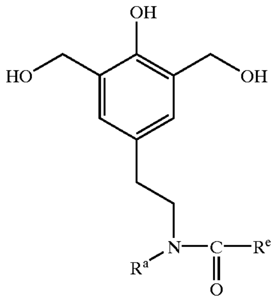
| | $R^a$ | $R^e$ |
|---|---|---|
| (B-1) | H | $C_2H_5$ |
| (B-2) | H | $^iPr$ |
| (B-3) | H | $^nBu$ |
| (B-4) | H | $^tBu$ |
| (B-5) | H | Ph |
TABLE 3
(Type C)
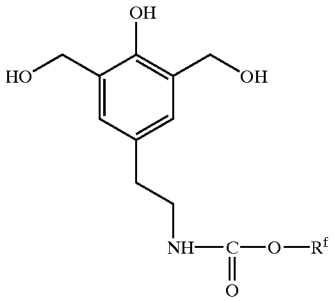
| | $R^f$ |
|---|---|
| (C-1) | $C_2H_5$ |
| (C-2) | $^iPr$ |
| (C-3) | $^nBu$ |
| (C-4) | Ph |
| (C-5) | $-CH_2-Ph$ |
TABLE 4
(Type D)
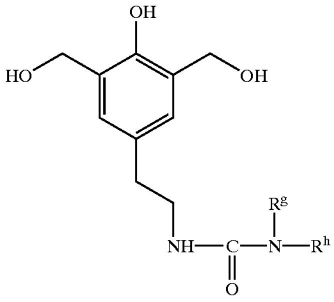
| | $R^g$ | $R^h$ |
|---|---|---|
| (D-1) | H | $^nBu$ |
| (D-2) | H | cyclo-$C_6H_{11}$ |
| (D-3) | H | Ph |
TABLE 4-continued
(Type D)
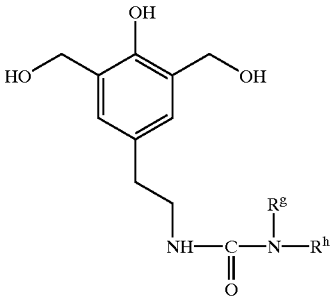
| | $R^g$ | $R^h$ |
|---|---|---|
| (D-4) | H | 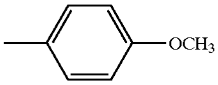 |
| (D-5) | H | 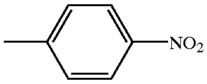 |
| (D-6) | $CH_3$ | $CH_3$ |
TABLE 5
(Type E)
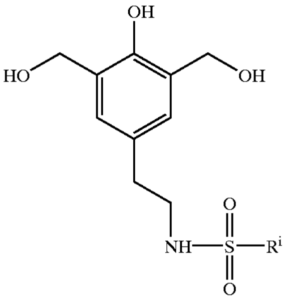
| | $R^i$ |
|---|---|
| (E-1) | $C_2H_5$ |
| (E-2) | Ph |
| (E-3) | 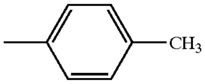 |
| (E-4) | 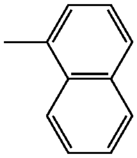 |
TABLE 6
(Type F)

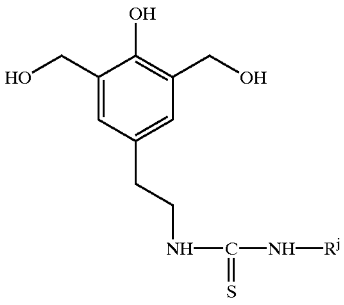
| | $R^j$ |
|---|---|
| (F-1) | $CH_2$—CH=$CH_2$ |
| (F-2) | $^{n}Bu$ |
| (F-3) | Ph |
TABLE 7
(Type G)
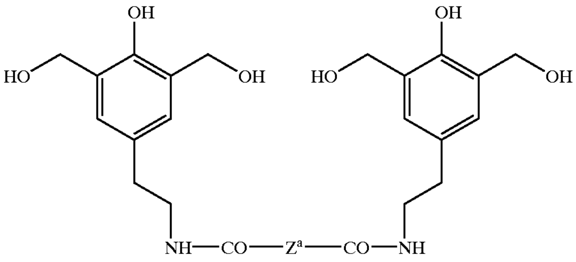
| | $Z^a$ |
|---|---|
| (G-1) | —$(CH_2)_4$— |
| (G-2) | 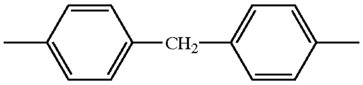 |
| (G-3) | 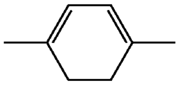 |
| (G-4) | —NH—$(CH_2)_6$—NH— |
| (G-5) | 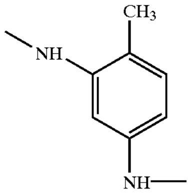 |
| (G-6) | 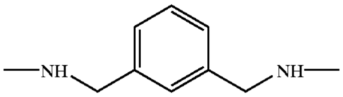 |
| (G-7) | —O—$(CH_2)_6$—O— |
| (G-8) | 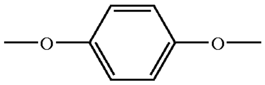 |
TABLE 8
(Type H)
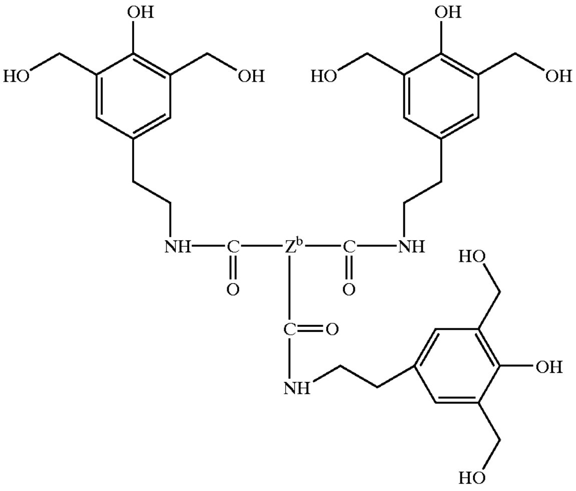
| | $Z^b$ |
|---|---|
| (H-1) | 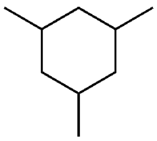 |
| (H-2) | 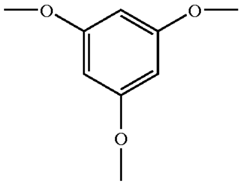 |
| (H-3) | 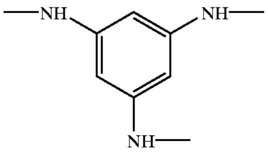 |
TABLE 9
(Type J)
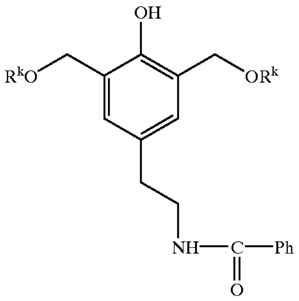
| | $R^k$ |
|---|---|
| (J-1) | $CH_3$ |
| (J-2) | $C_2H_5$ |

TABLE 9-continued
(Type J)
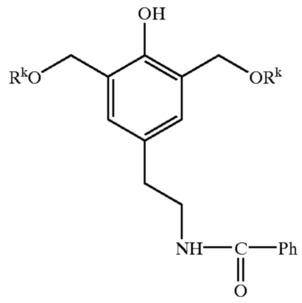
| | $R^k$ |
|---|---|
| (J-3) | $^i$Pr |
| (J-4) | 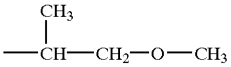 |
(S-1)
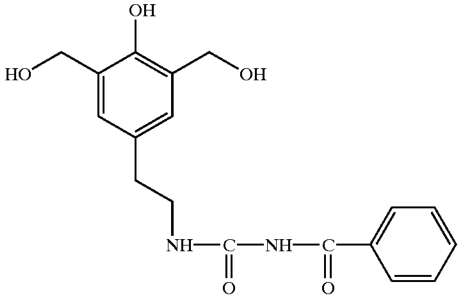
(S-2)
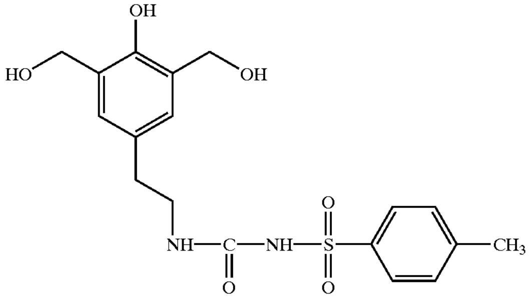
(S-3)
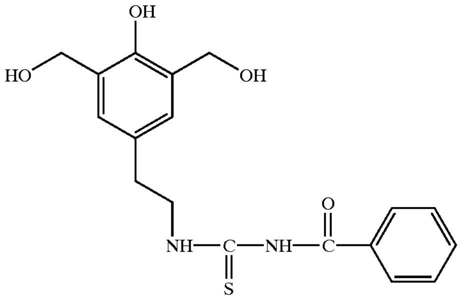
-continued
(S-4)
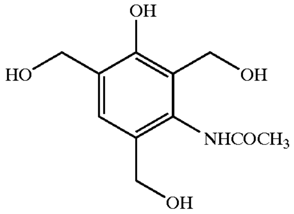
(S-5)
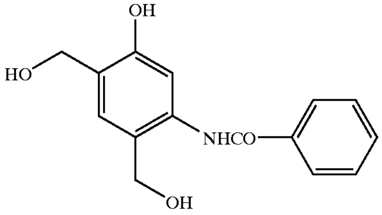
(S-6)
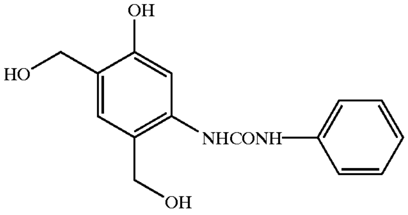
(S-7)
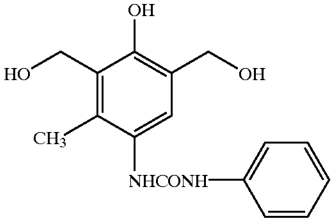
(S-8)
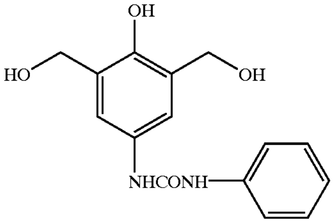
(S-9)
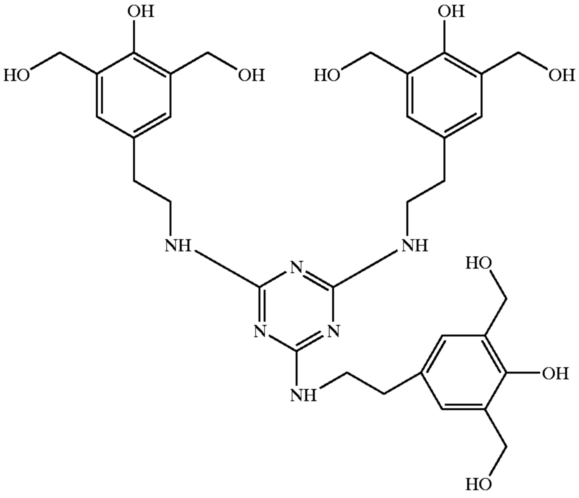

-continued
(S-10)
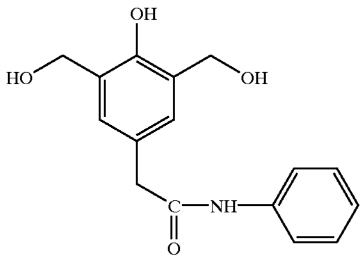
(S-11)
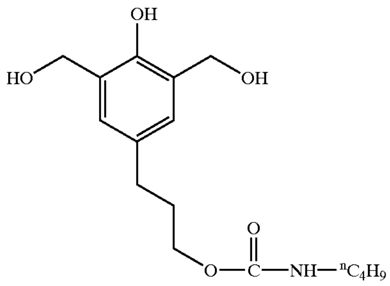
(S-12)
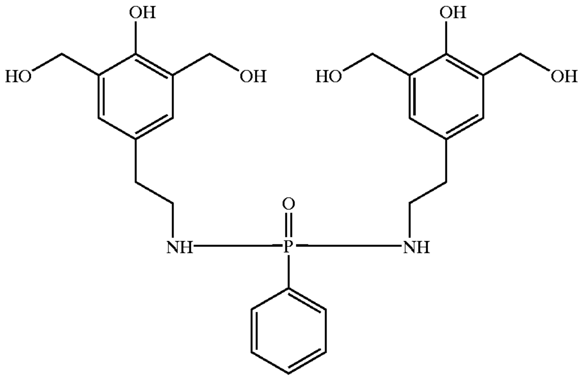
(S-13)
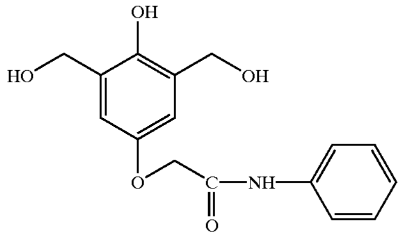
(S-14)
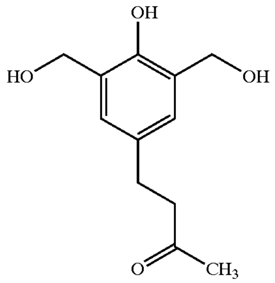
-continued
(S-15)
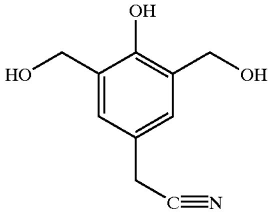
(S-16)
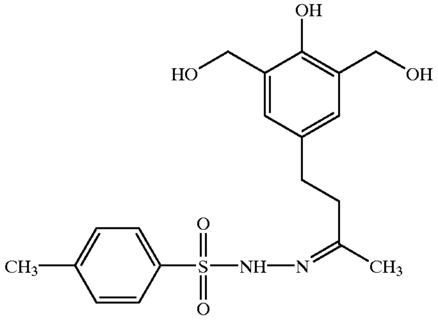
(S-17)
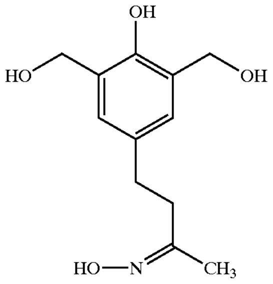
(S-18)
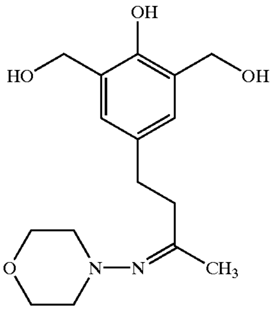
(S-19)
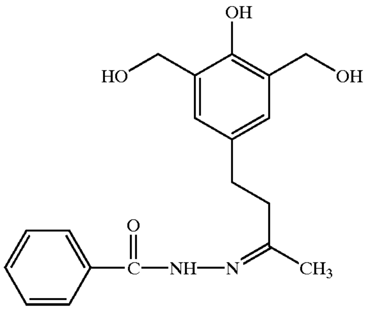

-continued
(S-20)
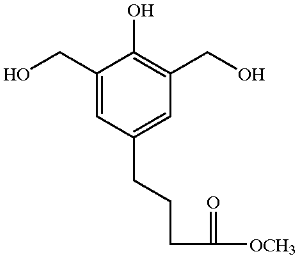
(S-21)
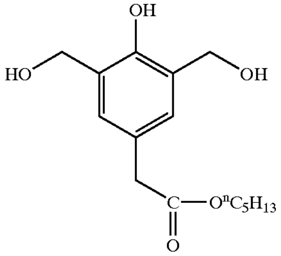
(S-22)
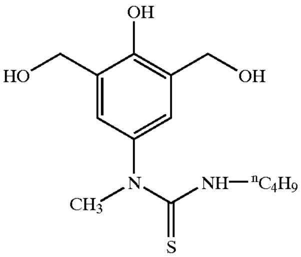
(S-23)
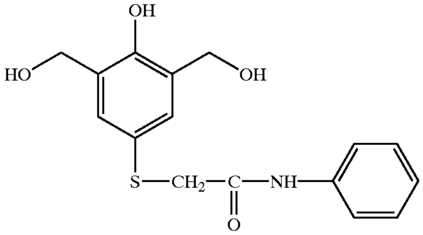
(S-24)
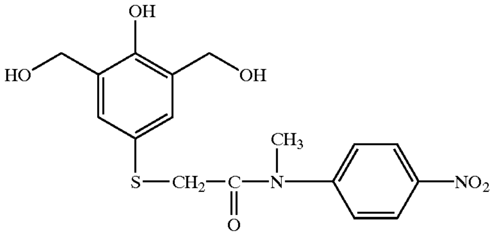
(S-25)
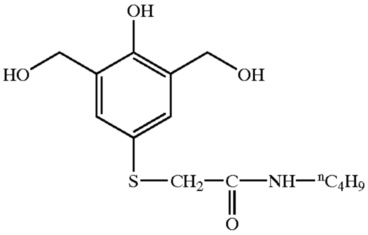
-continued
(S-26)
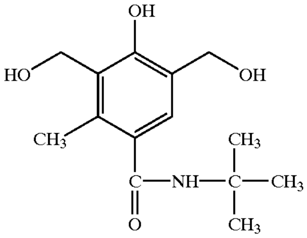
(S-27)
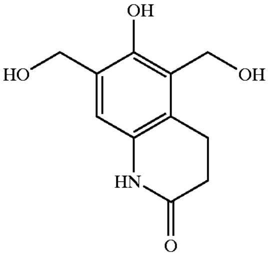
(S-28)
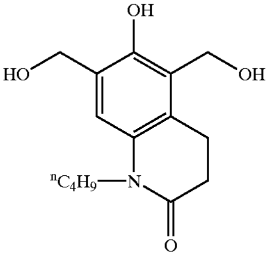
(S-29)
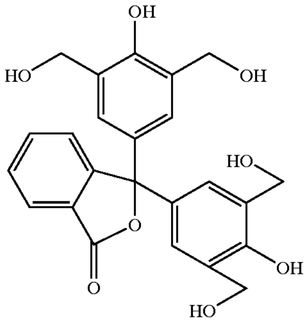
(S-30)
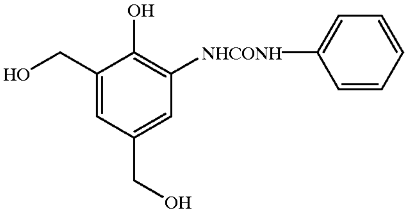
(S-31)
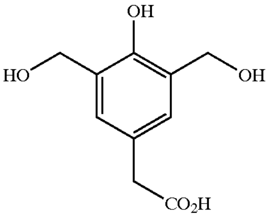

-continued
(S-32)
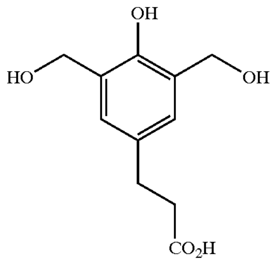
(S-33)
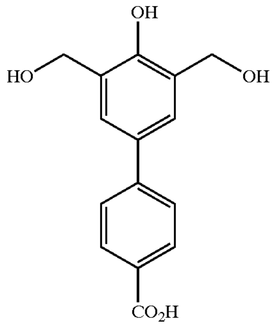
(S-34)
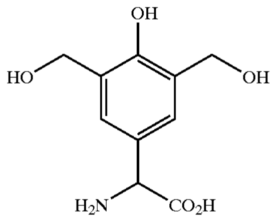
(S-35)
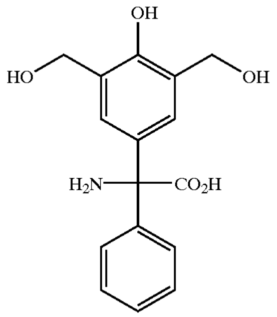
(S-36)
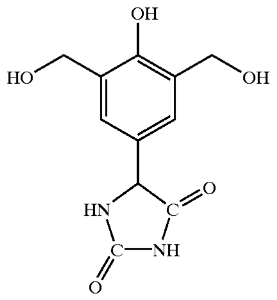
-continued
(S-37)
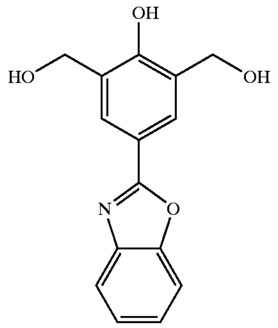
(S-38)
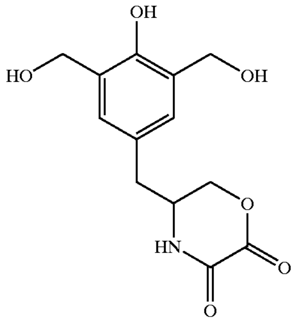
(S-39)
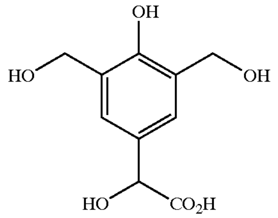
(S-40)
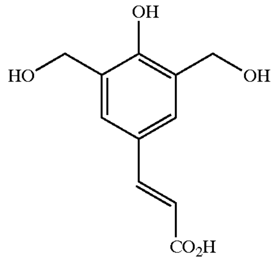
(S-41)
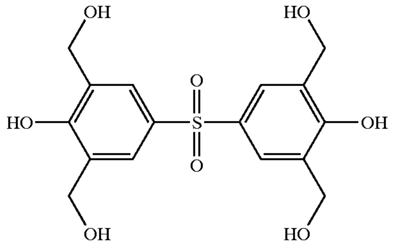

-continued
(S-42)
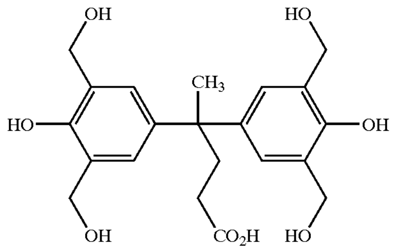
(S-43)
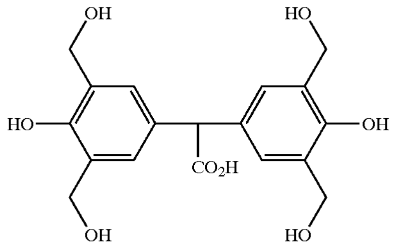
(S-44)
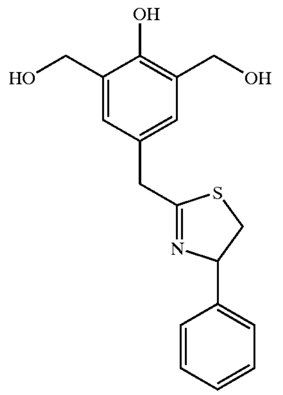
(S-45)
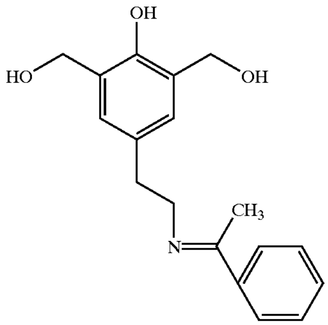
(S-46)
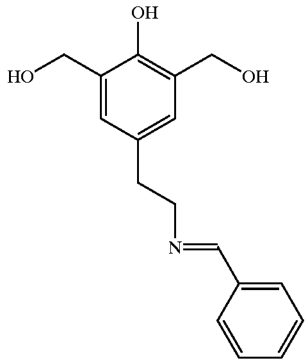
-continued
(S-47)
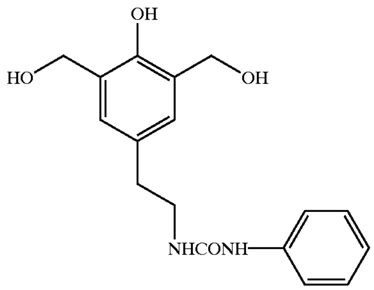
(S-48)
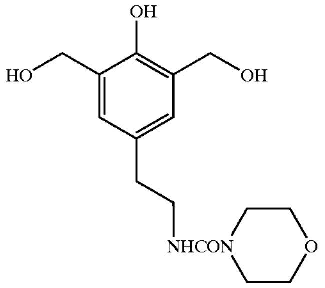
(S-49)
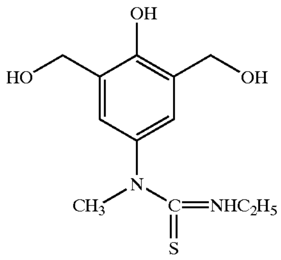
(S-50)
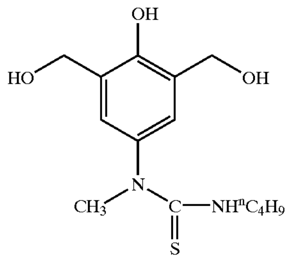
(S-51)
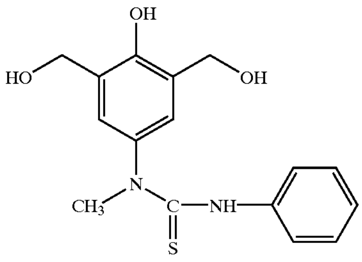
(S-52)
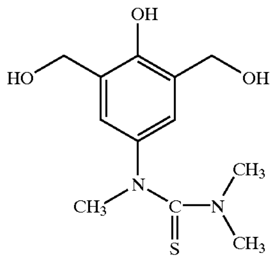

-continued
(S-53)
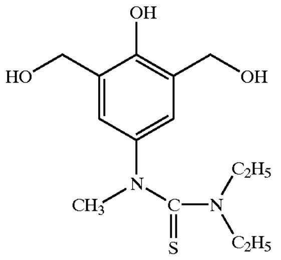
(S-54)
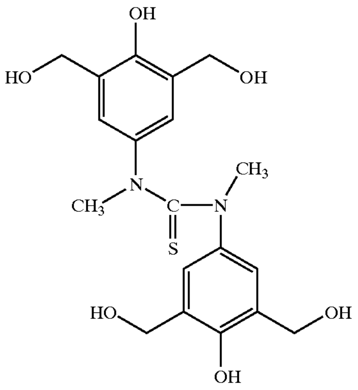
(S-55)
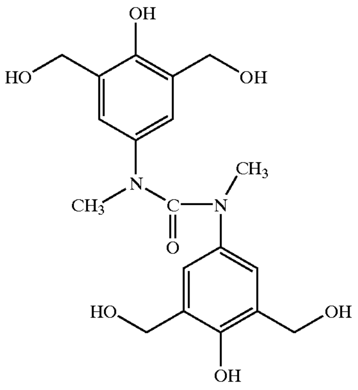
(S-56)
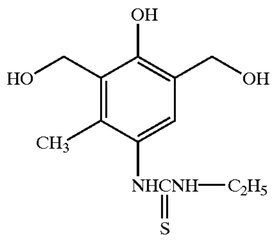
(S-57)
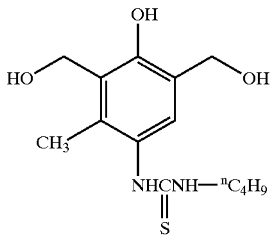
-continued
(S-58)
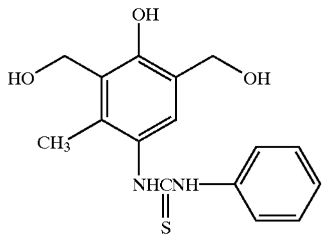
(S-59)
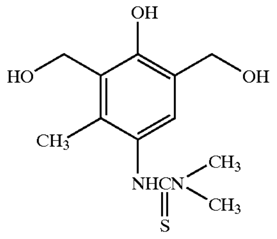
(S-60)
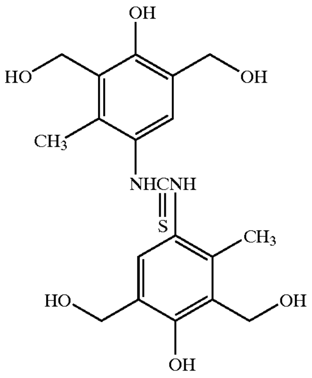
(S-61)
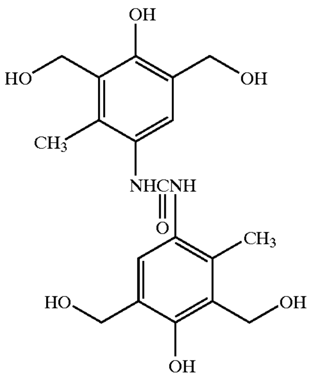
(S-62)
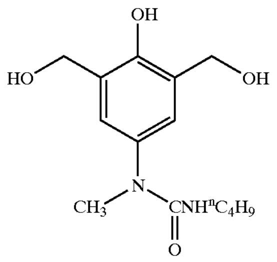

-continued
(S-63)
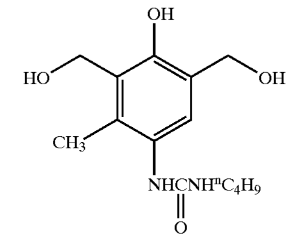
(S-64)
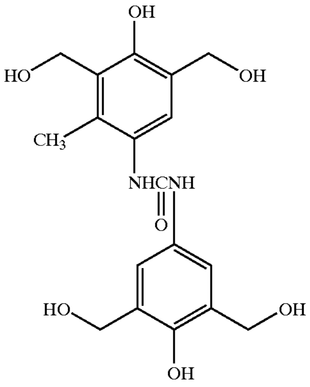
(S-65)
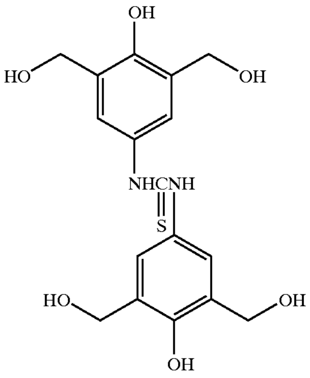
(S-66)
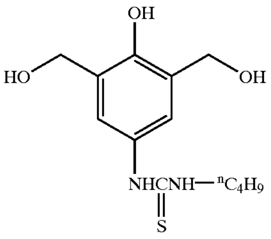
(S-67)
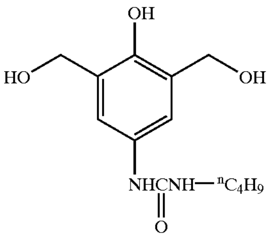
-continued
(S-68)
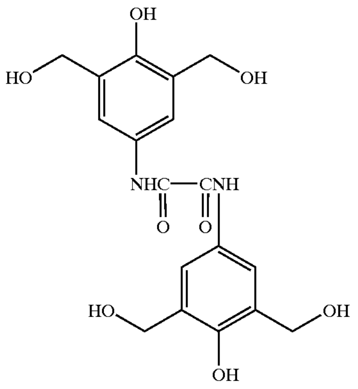
(S-69)
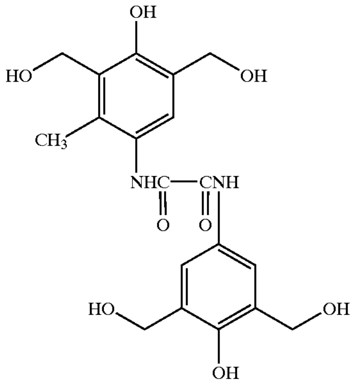
(S-70)
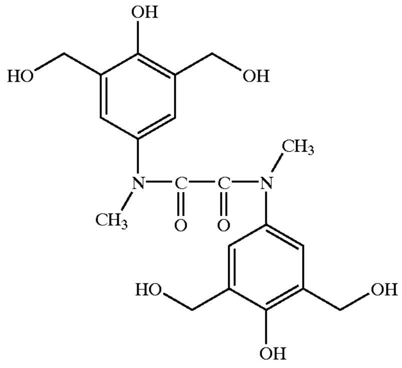
(S-71)
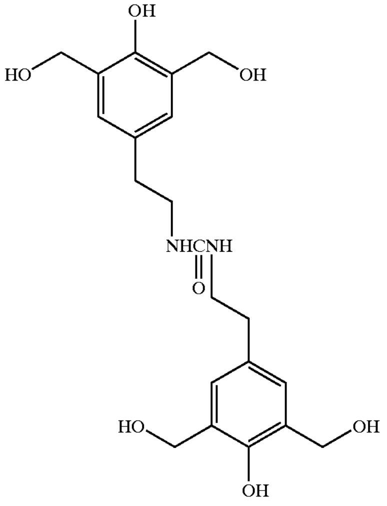

-continued (S-72)

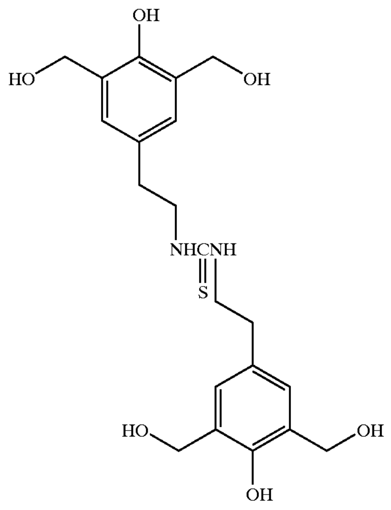

(S-73)

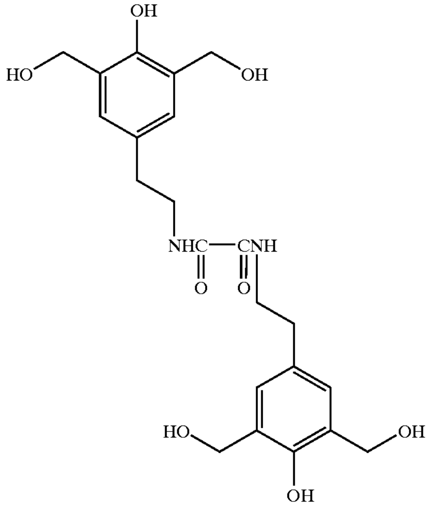

(S-74)

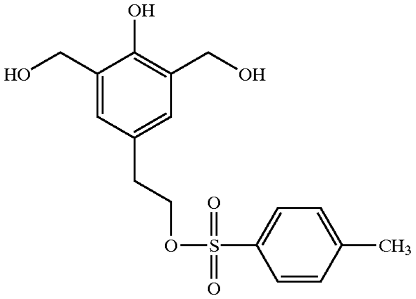

(S-75)

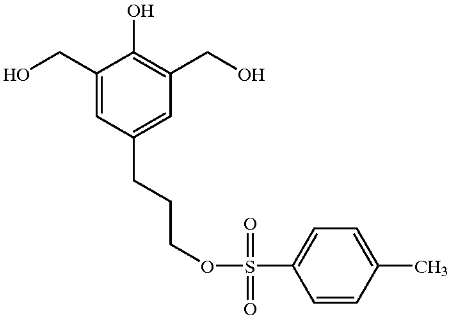

-continued (S-76)

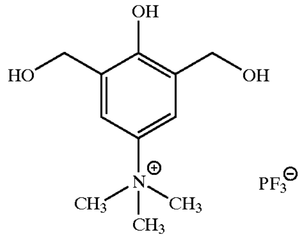

(S-77)

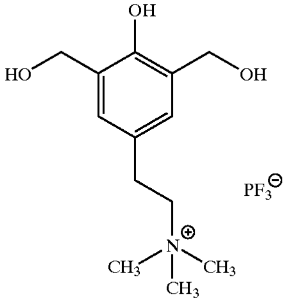

(S-78)

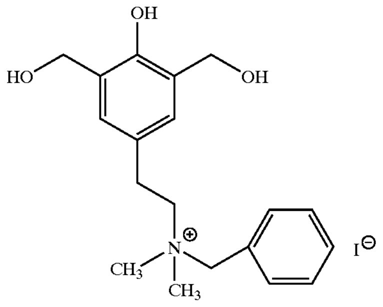

Among them, low-molecular-weight phenol derivatives having an amide or urea structure are preferable from the standpoint of effectiveness.

These low-molecular-weight phenol derivatives useful as the crosslinking agents can be synthesized by conventionally known methods. General synthetic methods are shown by the following schemes I and II.

Scheme I

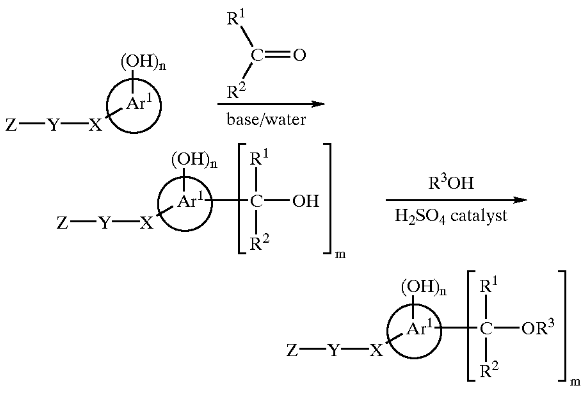

Scheme II

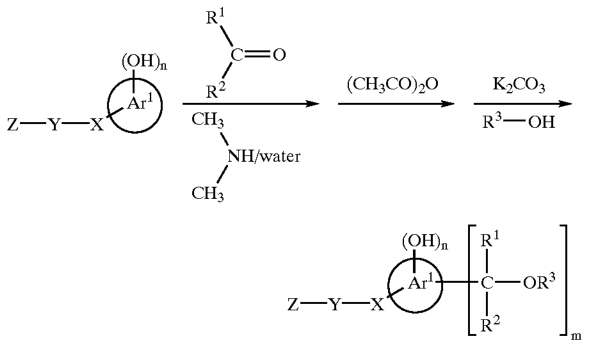

In the formulae, “base” indicates a strong alkali, for example, KOH, NaOH, $Me_4N^+OH$, or the like.

As shown above, a compound represented by the general formula (I) can be synthesized from a corresponding phenol derivative by hydroxyalkylation or alkoxylation using a carbonyl compound.

These low-molecular-weight phenol derivatives may be used singly or in combinations of two or more species. At the time these phenol derivatives are synthesized, even if a dimer or trimer is formed as an impurity from the condensation of the phenol derivatives themselves, the phenol derivatives containing such impurity may be used. If the phenol derivatives containing such impurity are used, the impurity content is preferably 30% or less and more preferably 20% or less.

Next, details of the polynuclear phenolic crosslinking agents represented by the general formula (II) are given below. As shown in the structural formula, the polynuclear phenolic crosslinking agents represented by the general formula (II) are polynuclear phenolic crosslinking agents which have in the molecule thereof 3 or more phenol rings each having 2 or 3 hydroxymethyl groups on the ring.

In the general formula (II) A is a hydrocarbon linking group which has 1 to 20 carbon atoms and a valency of r and which is formed by eliminating hydrogen from a skeleton composed of a straight-chain, branched or cyclic alkyl group or from an aryl group so that the valency of r is obtained.

More preferred examples of the linking group A include groups indicated by the following structures.

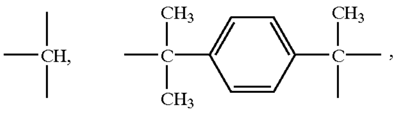

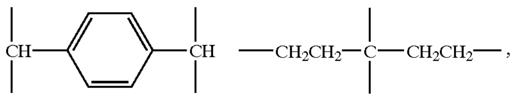

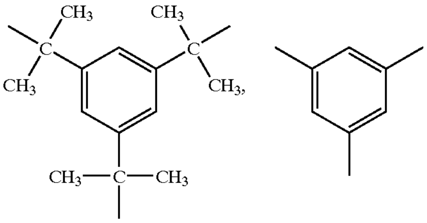

Preferably specific examples of the polynuclear phenolic crosslinking agents which are represented by the general formula (II) and have the above-listed linking groups A in the molecule thereof include, but are not limited to, the following (II-1) to (II-6) compounds.

II-1

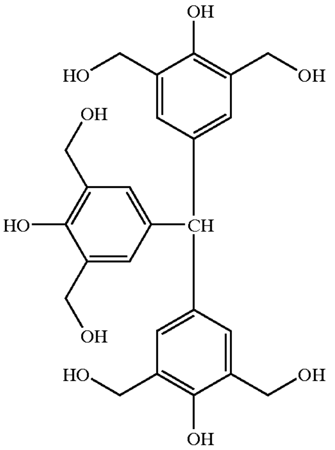

II-2

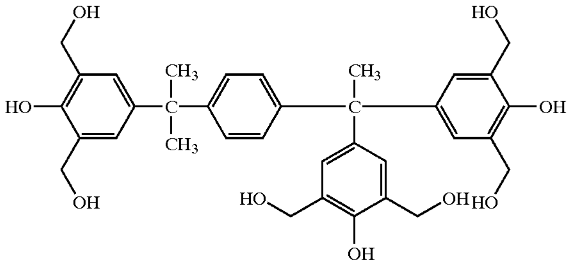

-continued

II-3

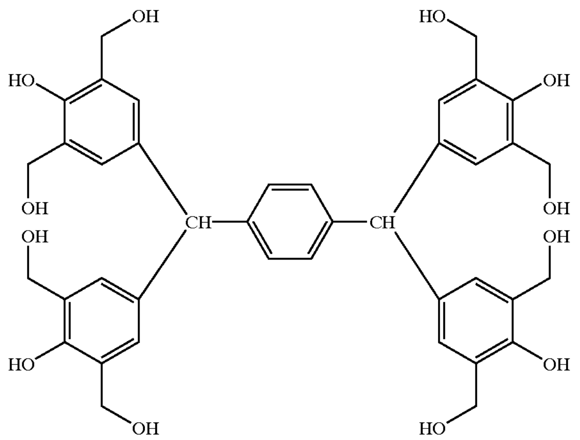

II-4

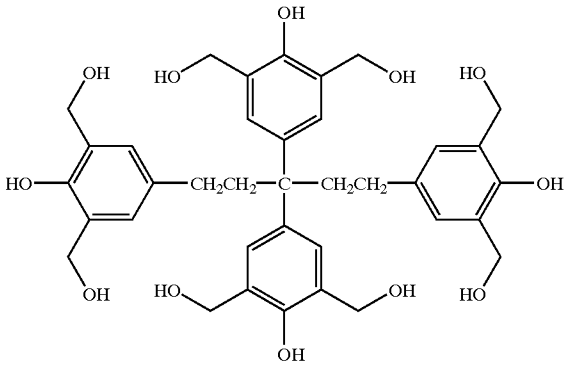

II-5

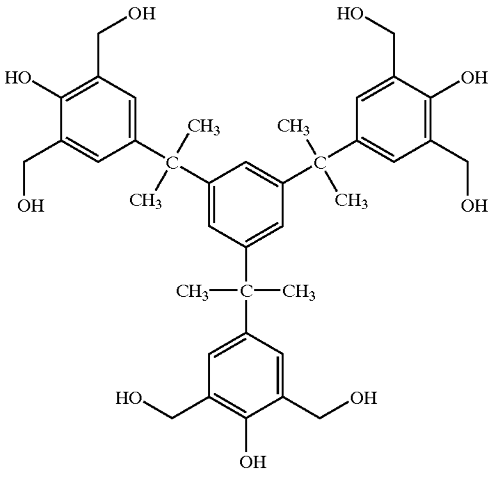

-continued

II-6

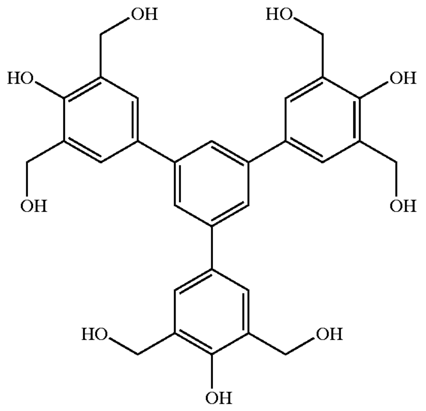

These compounds are obtained by subjecting corresponding polynuclear phenols to a methylolation reaction in a pathway similar to that in the previous explanation of the low-molecular-weight phenol derivatives. When using these compounds, the compounds containing byproducts such as oligomers formed in the methylolation reaction may be used. The byproduct content is preferably 10% by weight or less in this case, too.

As for the resol resins usable in the present invention, although there is no particular limitation, the compound disclosed as a resol resin in U. K. Patent No. 2,082,339 is preferable. In particular, a resin having a weight average molecular weight of 500–100,000 and a number average molecular weight of 200–50,000 is suitably used. If the molecular weight is too small, crosslinkability becomes low and plate life is shortened. If the molecular weight is too large, storage stability is liable to deteriorate.

Examples of the crosslinking components that can be used in the present invention include (1) a mixture of a low-molecular-weight phenol derivative and a polynuclear phenolic crosslinking agent, (2) a mixture of a low-molecular-weight phenol derivative and a resol resin, (3) a mixture of a low-molecular-weight phenol derivative, a polynuclear phenolic crosslinking agent, and a resol resin.

Another crosslinking agent that can be suitably used in the present invention is a compound which has in the molecule thereof two or more hydroxymethyl, alkoxymethyl, epoxy, aldehyde, ketone, or vinylether groups. Preferably, these crosslinkable functional groups are directly linked to an aromatic ring. Specific examples include methylol melamine, epoxidized novolak resins, urea resins, and so on. Also preferred are the compounds described in "Kakyozai Handobukku" (Handbook of Crosslinking Agents) (S. Yamashita and T. Kaneko, Taiseisha Co., Ltd.). In particular, a phenol derivative, which has in the molecule thereof two or more hydroxymethyl or alkoxymethyl groups, is preferable because of the strength of the image portions when images are formed.

However, these crosslinking agents are unstable in heat, and the storage stability is poor after the formation of the acid-crosslinkable layer. In contrast to this a phenol derivative, which has in the molecule thereof two or more hydroxymethyl or alkoxymethyl groups linked to a benzene ring and 3 to 5 benzene nuclei and whose molecular weight is 1,200 or less, has good storage stability and is most suitably used in the present invention. The alkoxymethyl group preferably has 6or less carbon atoms. Specifically, preferred examples of the alkoxymethyl group include methoxymethyl, ethoxymethyl, n-propoxymethyl, isopropoxymethyl, n-butoxymethyl, isobutoxymethyl, sec-butoxymethyl, and t-butoxymethyl groups. In addition, an alkoxy-substituted alkoxymethyl group, such as 2-methoxyethoxymethyl group or 2-methoxy-1-propoxymethyl group, is also preferable.

Specifically, examples of such compounds include the compounds described in JP-A Nos. 6-282067 and 7-64285 and EP No. 632003A1.

These crosslinking agents may be used singly or in combinations of two or more species.

In the present invention, these crosslinking agents are added in an amount of 5–70% by weight, preferably 10–65% by weight, based on the total weight of the solid components of the acid-crosslinkable layer. If the amount of the crosslinking agent is less than 5% by weight, film strength of image portions deteriorates when images are recorded, whereas if it is more than 70% by weight, storage stability is adversely affected.

Examples of the binder polymer that can be used in the acid-crosslinkable layer of the present invention include a polymer having in the side chain or main chain thereof an aromatic hydrocarbon ring to which a hydroxyl group or an alkoxy group is directly bonded. From the standpoint of sensitivity, the alkoxy group preferably has 20 or less carbon atoms. From the standpoint of the availability of raw materials, the aromatic hydrocarbon ring is preferably a benzene ring, a naphthalene ring, or an anthracene ring. Although these aromatic hydrocarbon rings may have substituents, such as a halogen group, a cyano group, and the like, other than the hydroxyl group or alkoxy group, these aromatic hydrocarbon rings preferably have no substituents except the hydroxyl group or alkoxy group from the standpoint of sensitivity.

The binder polymer that can be suitably used in the present invention is a polymer having the structural unit represented by the following general formula (III) or a phenolic resin that is a novolak resin or the like:

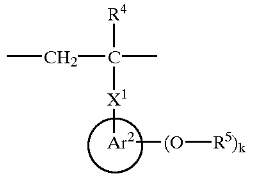

wherein $Ar^2$ represents a benzene ring, a naphthalene ring, or an anthracene ring; $R^4$ represents a hydrogen atom or a methyl group; $R^5$ represents a hydrogen atom or an alkoxy group having 20 or fewer carbon atoms; $X^1$ represents either a single bond or a bivalent linking group which contains at least one atom selected from C, H, N, O, and S and has 0 to 20 carbon atoms; and k is an integer of 1 to 4.

Examples of the structural units ([BP-1] to [BP-6]) that are represented by the general formula (III) and are suitably used in the present invention are given below. It should be noted, however, that the present invention is not limited to these examples.

[BP-1]

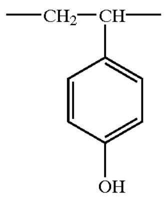

[BP-2]

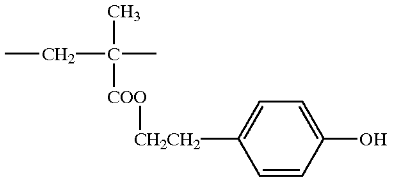

[BP-3]

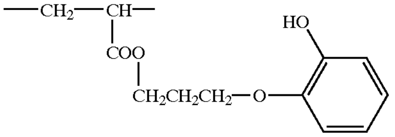

[BP-4]

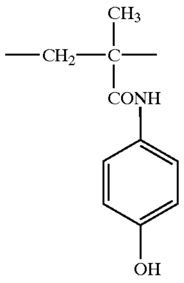

[BP-5]

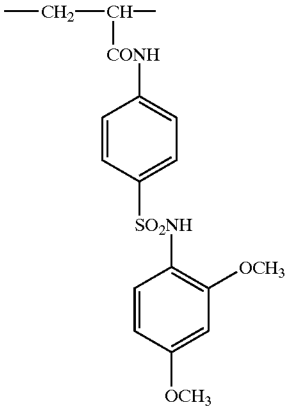

[BP-6]

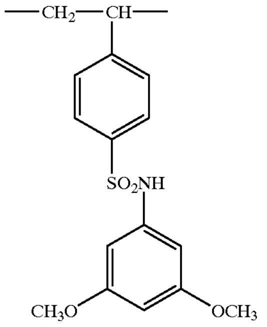

The polymers having the above-listed structural units can be obtained by conventionally known radical polymerization using corresponding monomers.

A homopolymer composed solely of the structural unit represented by the general formula (III) or a copolymer composed of this specific structural unit and a structural unit derived from other known monomers may be used as the binder polymer of the present invention.

The ratio of the structural unit that is represented by the general formula (III) and contained in the copolymer is preferably 50–100% by weight and more preferably 60–100% by weight.

The weight-average molecular weight of the polymer to be used in the present invention is preferably 5,000 or greater, more preferably 10,000 to 300,000, while the number-average molecular weight is preferably 1,000 or greater, and more preferably 2,000 to 250,000. The polydispersion degree (weight-average molecular weight/number-average molecular weight) is 1 or more and more preferably falls within the range of 1.1 to 10.

Although the polymer may be a random polymer, a block polymer, a graft polymer, or the like, the polymer is preferably a random polymer.

Next, novolaks are described. Examples of the novolak resin that can be suitably used in the present invention include phenol novolaks, o-, m-, or p-cresolnovolaks, copolymers thereof, and novolaks utilizing phenols substituted by a halogen atom, an alkyl group, or the like.

The weight-average molecular weight of the novolak resin is preferably 1,000 or greater, more preferably 2,000 to 20,000, while the number-average molecular weight is preferably 1,000 or greater, and more preferably 2,000 to 15,000. The polydispersion degree is 1 or greater, and more preferably falls within the range of 1.1 to 10.

It is also a preferred mode to use as the binder polymer a polymer which has a heterocyclic group having an unsaturated bond in the ring.

The term "heterocyclic group" as used herein means a group which includes one or more heteroatoms other than carbon atom among the atoms forming the ring. Nitrogen, oxygen, sulfur, and silicon atoms are preferred as the heteroatoms to be used. It is thought that, by using a polymer having such a heterocyclic group, a reaction becomes structurally more easy to occur due to the function of lone pairs present in the heterocyclic ring, so that a film having an excellent plate life is formed.

The heterocyclic ring that has an unsaturated bond in the ring and is suitably used in the present invention (this heterocyclic ring is hereinafter referred to simply as "heterocyclic ring") is a 5-member ring having 2 conjugated double bonds, a 6-member ring having 3 conjugated double bonds, or a condensed heterocyclic ring made up of these heterocyclic rings. Since these heterocyclic rings have aromatic properties, these are called aromatic heterocyclic rings. In addition to the aforementioned heterocyclic rings, particularly preferable are heterocyclic rings, such as a benzene ring or a naphthalene ring, which have been condensed.

Examples of the heterocyclic rings that are suitably used in the present invention include mono-heterocyclic rings such as pyrrole, furan, thiophene, oxazole, isooxazole, thiazole, isothiazole, imidazole, pyrazole, furazan, oxadiazole, pyridine, pyridazine, pyrimidine, pyrazine, triazine, silabenzene, and the like; and condensed heterocyclic rings such as indole, isoindole, benzofuran, benzothiophene, indolysine, quinoline, isoquinoline, purine, indazole, benzoimidazole, benzothiazole, benzooxazole, quinazoline, cinnoline, quinoxaline, furatazine, pteridine, carbazole, acridine, phenanthridine, xanthene, phenazine, phenothiazine, and the like. These heterocyclic rings may have a substituent. Preferred examples of the substituent include a hydrocarbon group having 20 or fewer carbon atoms, an alkoxy group having 20 or fewer carbon atoms, an aryl group having 20 or fewer carbon atoms, and a halogen atom.

In the polymer having this heterocyclic group, although the heterocyclic group may be introduced into the polymer as a component forming the polymer main chain, the heterocyclic group is preferably linked as a pendant to the side chain of the polymer for the reason of imparting a higher film strength to the images. In this case, although the heterocyclic group may be directly bonded to the polymer side chain, the heterocyclic group is preferably linked via a proper linking chain also for the reason of imparting a higher film strength to the images. Preferred examples of the linking chain include an ester linkage, a carboxylic acid amide linkage, a sulfonic acid amide linkage, an ether linkage, a thioether linkage, and an organic group which has 20 or fewer carbon atoms and may contain any of these linkages. As for the polymer main chain, although it may be a vinyl polymer constituting the main chain of poly(meth) acrylate, polystyrene, polyvinyl acetal or the like, polyester, polyurethane, and so on, a vinyl polymer is preferable from the standpoint of availability and economical reasons.

The above-mentioned binder polymers may be used singly or in combinations of two or more species. These polymers are added in an amount of 20–95% by weight, preferably 40–90% by weight, based on the total weight of the solid components of the acid-crosslinkable layer. If the amount of the polymer is less than 20% by weight, the strength of image portions becomes insufficient when images are formed, whereas if it is more than 95% by weight, no images are not formed.

From the standpoint of raising sensitivity, it is preferable that this acid-crosslinkable layer also contains an infrared absorbent. The infrared absorbents that can be used in the acid-crosslinkable layer may be the same as the infrared absorbents listed in the previous description of the radical-polymerizable layer.

The contents in the acid-crosslinkable layer are preferably 0.01–50% by weight, more preferably 0.1–10%by weight, particularly preferably 0.5–10% by weight in the case of dyes for use as infrared absorbents, and particularly preferably 1.0–10% by weight in the case of pigments, based on the total weight of the solid components of the acid-crosslinkable layer. If the content of the pigment or dye is less than 0.01% by weight, the effect of raising sensitivity insufficient, whereas if it is more than 50% by weight, stains are generated at non-image portions during printing.

When the acid-crosslinkable layer is formed, a variety of additives such as a surfactant and the like may be added for such purposes as improving coatability and film quality.

In the acid-crosslinkable layer of the present invention, the above-described components are generally dissolved in a solvent and the resultant solution is coated onto a suitable support. The concentration of the above-described components in the solution (the total solid components including additives) is preferably 1–50% by weight. The coating amount (solid components) on the support obtained after coating and drying varies in accordance with use, but in terms of a planographic plate material, generally 0.01–5.0 $g/m^2$ is preferable as an acid-crosslinkable layer.

Various methods can be employed as the method for coating. Examples include bar coater coating, rotation coating, spray coating, curtain coating, dip coating, air knife coating, blade coating, and roll coating. As the coating amount becomes smaller, the film characteristics of the recording layer deteriorate although apparent sensitivity increases.

Supports

The support, to which the acid-crosslinkable layer and the radical-polymerizable layer as the image forming material of the present invention can be coated, is a dimensionally-stable, plate-shaped material. Examples of the support include paper, paper laminated with a plastic (e.g., polyethylene, polypropylene, polystyrene, etc.), metal plates (e.g., aluminum, zinc, copper, etc.), plastic films (e.g., cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate, polyvinyl acetal, etc.), and paper or plastic films laminated or deposited with a metal such as one selected from among the above-mentioned metals.

Preferably, a polyester film or an aluminum plate is used as the support. An aluminum plate is particularly preferred due to its good dimension stability and comparatively low price. A pure aluminum plate and an aluminum-based alloy plate containing traces of elements dissimilar to aluminum are suitable. A plastic film laminated or vapor-deposited with aluminum can also be used. Examples of the dissimilar elements contained in the aluminum alloy include silicon, iron, manganese, copper, magnesium, chromium, zinc, bismuth, nickel, and titanium. The total amount of the dissimilar elements in the alloy is 10% by weight or less. Pure aluminum is particularly suitable for the present invention. However, because completely pure aluminum is extremely difficult to manufacture from the standpoint of refinement technology, aluminum which contains slight amounts of dissimilar elements may also be used. Thus, the composition of the aluminum plate that may be used in the present invention is not specified, and a conventionally known and utilized aluminum plates may be suitably used. The thickness of the aluminum plate for use in the present invention is approximately 0.1–0.6 mm, preferably 0.15–0.4 mm, and particularly preferably 0.2–0.3 mm in particular.

Before roughening the aluminum plate, a degreasing treatment may be optionally performed to remove the drawing oil from the plate surface. For example, the degreasing treatment is performed by use of a surfactant, an organic solvent, an alkali aqueous solution, or the like.

The surface of the aluminum plate may be roughened by use of a variety of methods: mechanical roughening, roughening by electrochemically dissolving the surface, and roughening by chemically dissolving selected surface portions. Mechanical methods that may be used include known methods such as a ball abrasion method, a brush abrasion method, ablast abrasion method, a buff abrasion method, and others. Electrochemical roughening may be performed by passing an alternating or direct current in an electrolyte solution containing hydrochloric acid or nitric acid. Alternatively, a mechanical method and a chemical method may be used in combination as disclosed in JP-A No. 54-63902.

The thus-roughened aluminum plate, after being subjected to an alkali etching treatment and a neutralizing treatment as the necessity arises, may also be subjected to an anodization treatment in order to raise the water retention and abrasion resistance of the surface. Various kinds of electrolytes which form porous oxide film may be employed as the electrolyte used in the anodization treatment of the aluminum plate. In general, sulfuric acid, phosphoric acid, oxalic acid, chromic acid, and mixtures thereof may be used. The concentration of the electrolyte solution is suitably determined in accordance with the species of the electrolyte.

Depending on the necessity, the surface of the aluminum plate may be subjected to a hydrophilization treatment after the anodization treatment has been administered. Examples of the hydrophilization treatment that may be used in the present invention include a method making use of an alkali metal silicate (e.g., an aqueous sodium silicate solution) disclosed in U.S. Pat. Nos. 2,714,066, 3,181,461, 3,280,734, and 3,902,734. According to this method, a support is treated by immersion or electrolysis in an aqueous sodium silicate solution. Other usable methods include a method in which the surface is treated with an aqueous solution of potassium fluorozirconate disclosed in JP-B No. 36-22,063 and a method in which the surface is treated with an aqueous solution of polyvinylsulfonic acid as disclosed in U.S. Pat. Nos. 3,276,868, 4,153,461, and 4,689,272.

Prior to the coating of the constituent layers of the image forming material of the present invention, an undercoat layer may be provided on the support, if necessary.

A variety of organic compounds may be used as the components of the undercoat layer. For example, the organic compounds are selected from carboxymethyl cellulose; dextrin; gum arabic; phosphonic acids having an amino group such as 2-aminoethylphosphonic acid; organic phosphonic acids such as (substituted) phenylphosphonic acid, (substituted)naphthylphosphonic acid, (substituted) alkylphosphonic acid, (substituted)glycerophosphonic acid, (substituted)methylenediphosphonic acid, and (substituted) ethylenediphosphonic acid; organic phosphoric acids such as (substituted)phenylphosphoric acid, (substituted) naphthylphosphoric acid, (substituted)alkylphosphoric acid, and (substituted)glycerophosphoric acid; organic phosphinic acids such as (substituted)phenylphosph acid, (substituted naphthylphosphinic acid, (substituted)alkylphosphinic acid, and (substituted)glycerophosphinic acid; amino acids such as glycine and β-alanine; and hydrochlorides of amines having a hydroxyl group such as triethanolamine hydrochloride. These compounds may be used in combinations of two or more species. In addition, the use of the previously described diazonium compound as an undercoat is also preferable.

A suitable coating amount of the organic undercoat layer is 2–200 $mg/m^2$.

As stated above, the negative-type image forming material of the present invention can be obtained. The negative-type image forming material may be recorded by an infrared laser. In addition, thermal recording by use of an ultraviolet lamp or a thermal head is also possible. In the present invention, it is preferable that the material is exposed to a solid-state laser or semiconductor laser which emits an infrared ray having a wavelength ranging from 760 nm to 1200 nm.

If necessary, the image forming material of the present invention is thermally treated, and thereafter it is developed preferably in water or an alkaline aqueous solution.

When an alkaline aqueous solution is used, a conventionally known alkali aqueous solution may be used as the developing solution or replenisher solution for the image forming material of the present invention. For example, there may be used inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide. In addition, there may be used organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

These alkali agents are used singly or in combinations of two or more species.

Among these alkali agents, an example of a particularly preferred developing solution is an aqueous solution of a silicate such as sodium silicate or potassium silicate. This is because the adjustment of developability becomes possible by varying the ratio of silicon oxide $Sio_2$ to alkali metal oxide $M_2O$, which are components of the silicate, or the concentration of these components. For example, the alkali metal silicates described in JP-A No. 54-62004 and JP-B No. 57-7427 are advantageously used.

The planographic plate obtained in the above-described procedures, may be coated with a desensitizing gum if necessary, and subsequently forwarded to a printing process. When even longer plate life is desired, the planographic plate may be subjected to conventional post-treatments such as a burning treatment, a thermal treatment by means of a burning processor, water-rinsing, gum coating, and the like.

The planographic plate obtained by the treatments described above is set to an offset printing machine or the like and used for producing a large number of prints.

EXAMPLES

The present invention will next be described in detail by way of examples, which should not be construed as limiting the invention.

Support Making

An aluminum plate (material 1050) having a thickness of 0.30 mm was degreased. Thereafter, the surface of the plate was grained by use of a nylon brush and an aqueous suspension of a 400-mesh powder of pumice stone, then washed with water sufficiently. The plate was etched by being immersed in a 25% sodium hydroxide aqueous solution at 45° C. for 9 seconds and washed with water. The plate was further immersed in a 2% $HNO_3$ aqueous solution for 20 seconds and washed with water. The etching amount of the grained surface at this time was about 3 $g/m^2$. Subsequently, the aluminum plate was coated with an anodically oxidized film of 3 $g/m^2$ by using a 7% $H_2SO_4$ aqueous solution as an electrolyte solution and a direct current at a current density of 15A $g/dm^2$. The aluminum plate was then washed with water and dried. Thereafter, the aluminum plate was coated with an undercoat liquid having the following composition, and dried at 80° C. for 30 seconds. The coating amount after drying was 10 $g/m^2$.

| Undercoat liquid | |
|---|---|
| phenylsulfonic acid | 0.10 g |
| polyvinylbenzoic acid (molecular weight: 3,000) | 0.02 g |
| methanol | 40.0 g |
| pure water | 60.0 g |

Examples 1-1 to 1-9

The supports that had been coated with the above-described undercoat were coated, respectively, with solutions 1 having the following compositions for forming radical-polymerizable layer, and dried at 100° C. for 3 minutes. In this way, the radical-polymerizable layer was formed. The coating weight after drying was 1.5 $g/m^2$.

Solution 1 for Forming Radical-polymerizable Layer

| | |
|---|---|
| Polymer [P] of Table 10 | 1.0 g |
| Dipentaerythritol hexacrylate | 0.7 g |

(DHPA manufactured Nippon Kayaku Co., Ltd.)

| | |
|---|---|
| Radical generator [Q] of Table 10 | 0.1 g |
| Infrared absorbent [R] of Table 10 | r g |
| Additive [S] of Table 10 | 0.1 g |
| Acetone | 15.0 g |
| Methanol | 4.0 g |
| Pure water | 1.0 g |

(P-1) methyl methacrylate/methacrylic acid (70% by weight/30% by weight) copolymer (Mw: 30000)

(P-2) benzyl methacrylate/methacrylic acid/acrylonitrile (60% by weight/30% by weight/10% by weight) copolymer (Mw: 20000)

(P-3) styrene/acrylic acid (70% by weight/30% by weight) copolymer (Mw: 10000)

(Q-1) benzoyl peroxide (Q-2) p-nitrobenzene diazonium $PF_6^-$ salt (Q-3) 2,2'-azobisisobutyronitrile (R-1) Dispersion of carbon black (carbon black content: 33% by weight)

(R-2)

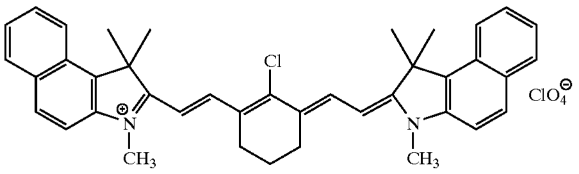

-continued (R-3)

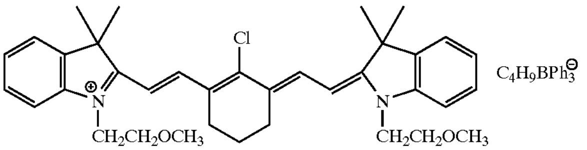

(S-1)

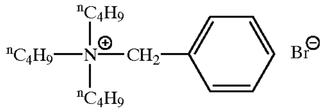

(S-2)

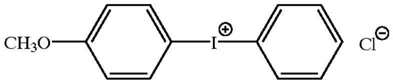

(S-3)

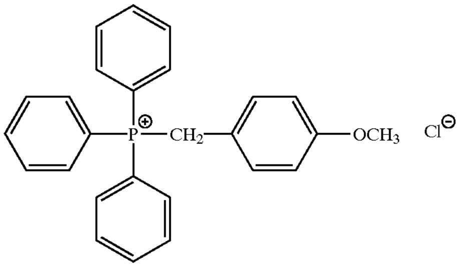

(S-4)

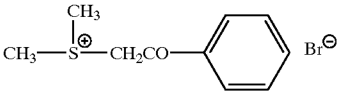

(S-5)

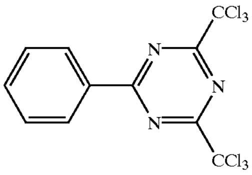

Subsequently, the supports were coated, respectively, with the following solutions 1 for forming an acid-crosslinkable layer, and dried at 130° C. for 30 seconds so as to form an acid-crosslinkable layer over the above-described radical-polymerizable layer. In this way, the image forming materials of Examples 1-1 to 1-9 were obtained. The total coating weight after drying was 2.0 g/$m^2$.

| Solution 1 for forming acid-crosslinkable layer | |
|---|---|
| Crosslinking agent [X] of Table 10 | 0.5 g |
| Polymer [Y] of Table 10 | 1.5 g |
| Acid-generating agent [Z] of Table 10 | 0.20 g |
| Infrared absorbent [A] of Table 10 | 0.15 g |
| Coloring agent (AIZEN SPILON BLUE C-RH, manufactured by Hodogaya Chemical Co., Ltd.) | 0.015 g |
| Fluorine-containing surfactant (MEGAFAC F-177, manufactured by Dainippon Ink and Chemicals Inc.) | 0.06 g |
| γ-butyrolactone | 15.0 g |
| Methanol | 5.0 g |
| Toluene | 2.0 g |

(X-1) resol resin (Mw: 3000)

(X-2)

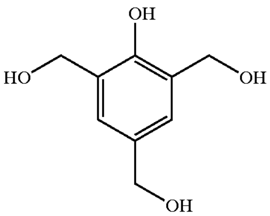

(X-3)

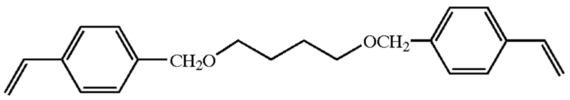

-continued
(X-4)
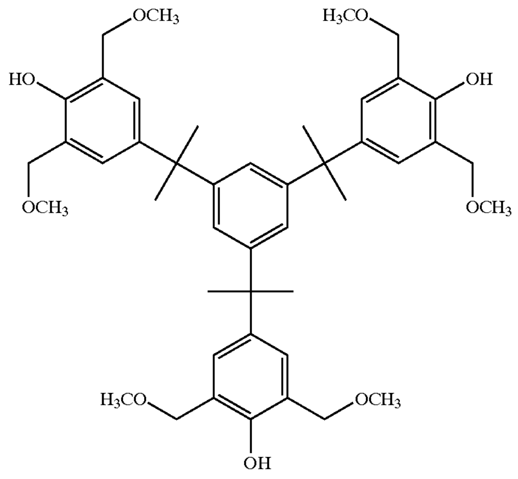
(Y-1) m-cresol/p-cresol (70% by weight/30% by weight)/formalin condensate novolak resin (Mw: 10000)
(Y-2) poly-p-hydroxystyrene (Mw: 40000)
(Y-3)
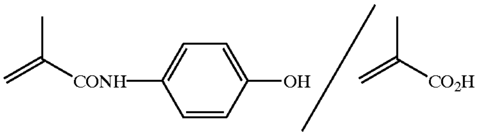
(90% by weight/10% by weight) copolymer (Mw: 20000)
(Y-4)
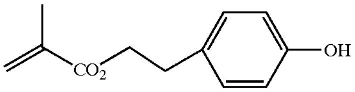
homopolymer (Mw: 30000)
(Z-1)
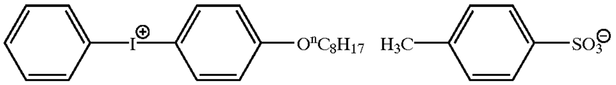
(Z-2)
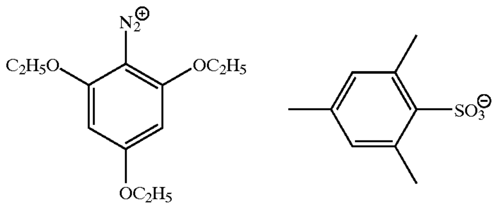
(A-1)
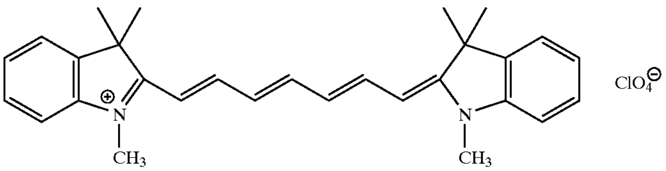

-continued (A-1)

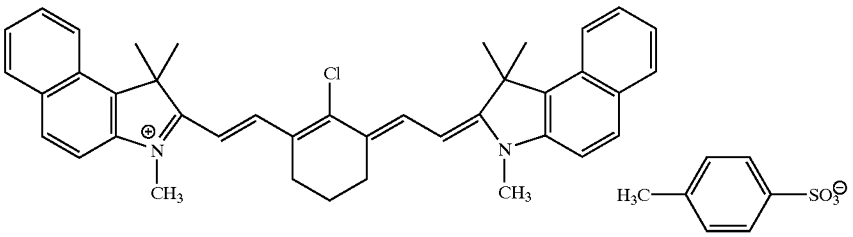

Examples 2-1 to 2-9

The supports, which had been coated with the above-described undercoat, were coated, respectively, with the above-described solutions 1 for forming an acid-crosslinkable layer, and dried at 100° C. for 3 minutes so as to form acid-crosslinkable layers. The coating weight after drying was 0.5 g/$m^2$.

Subsequently, the supports were coated, respectively, with the above-described solutions 1 for forming a radical-polymerizable layer, and dried at 130° C. for 30 seconds so as to form a radical-polymerizable layer over the above-described acid-crosslinkable layer. In this way, the image forming materials of Examples 2-1 to 2-9 were obtained. The total coating weight after drying was 2.0 g/$m^2$.

TABLE 10

| | Acid-crosslinkable layer | | | | Radical-polymerizable layer | | | |
|---|---|---|---|---|---|---|---|---|
| | Crosslinking agent | Polymer | Acid-generating agent | Infrared absorbent | Polymer | Radical generator | Infrared absorbent (amount added) | Additive |
| Example 1-1,2-1 | X-1 | Y-1 | Z-1 | A-1 | P-1 | Q-1 | R-1(1.0) | None |
| Example 1-2,2-2 | X-2 | Y-2 | Z-1 | A-1 | P-2 | Q-1 | R-1(1.0) | None |
| Example 1-3,2-3 | X-3 | Y-1 | Z-2 | A-2 | P-1 | Q-1 | R-2(0.1) | S-1 |
| Example 1-4,24 | X-4 | Y-1 | Z-2 | A-2 | P-2 | Q-2 | R-2(0.1) | S-2 |
| Example 1-5,2-5 | X-4 | Y-3 | Z-2 | A-2 | P-3 | Q-3 | R-2(0.1) | S-3 |
| Example 1-6,2-6 | X-4 | Y-4 | Z-1 | A-2 | P-1 | Q-4 | R-2(0.1) | S-4 |
| Example 1-7,2-7 | X-1 | Y-1 | Z-1 | A-2 | P-2 | Q-1 | R-2(0.1) | S-5 |
| Example 1-8,2-8 | X-2 | Y-3 | Z-2 | A-2 | P-1 | Q-3 | R-3(0.1) | S-1 |
| Example 1-9,2-9 | X-3 | Y-4 | Z-1 | A-2 | P-1 | Q-3 | R-3(0.1) | S-1 |

Comparative Examples 1 to 9

The supports, which had been coated with the above-described undercoat as in Example 1, were coated, respectively, with the solutions 1 for forming an acid-crosslinkable layer, wherein crosslinking agents, polymers, infrared absorbents, etc. were changed in accordance with Table 11. Then the supports were dried at 100° C. for 3 minutes so as to obtain image forming materials each having only an acid-crosslinkable layer (oxygen-transmission controlling layer) on the support. The coating weight after drying was 0.5 g/$m^2$.

TABLE 11

| | Acid-crosslinkable layer | | | |
|---|---|---|---|---|
| | Crosslinking agent | Polymer | Acid-generating agent | Infrared absorbent |
| Comparative Example 1 | X-1 | Y-1 | Z-1 | A-1 |
| Comparative Example 2 | X-2 | Y-2 | Z-1 | A-1 |
| Comparative Example 3 | X-3 | Y-1 | Z-2 | A-2 |
| Comparative Example 4 | X-4 | Y-1 | Z-2 | A-2 |
| Comparative Example 5 | X-4 | Y-3 | Z-2 | A-2 |
| Comparative Example 6 | X-4 | Y-4 | Z-1 | A-2 |

TABLE 11-continued

| | Acid-crosslinkable layer | | | |
|---|---|---|---|---|
| | Crosslinking agent | Polymer | Acid-generating agent | Infrared absorbent |
| Comparative Example 7 | X-1 | Y-1 | Z-1 | A-2 |
| Comparative Example 8 | X-2 | Y-3 | Z-2 | A-2 |
| Comparative Example 9 | X-3 | Y-4 | Z-1 | A-2 |

Comparative Examples 10 to 18

The supports, which had been coated with the above-described undercoat as in Example 1, were coated, respectively, with the solutions 1 for forming a radical-polymerizable layer, wherein radical generators, infrared absorbents, etc. were changed in accordance with Table 12. Then the supports were dried at 130° C. for 30 seconds so as to obtain image forming materials each having only a radical-polymerizable layer on the support. The coating weight after drying was 1.5 g/$m^2$.

TABLE 12

| | Radical-polymerizable layer | | | |
|---|---|---|---|---|
| | Polymer | Radical generator | Infrared absorbent (amount added) | Additive |
| Comparative Example 10 | P-1 | Q-1 | R-1(1.0) | None |
| Comparative Example 11 | P-2 | Q-1 | R-1(1.0) | None |
| Comparative Example 12 | P-1 | Q-1 | R-2(0.1) | S-1 |
| Comparative Example 13 | P-2 | Q-2 | R-2(0.1) | S-2 |
| Comparative Example 14 | P-3 | Q-3 | R-2(0.1) | S-3 |
| Comparative Example 15 | P-1 | Q-4 | R-2(0.1) | S-4 |
| Comparative Example 16 | P-2 | Q-1 | R-2(0.1) | S-5 |
| Comparative Example 17 | P-1 | Q-3 | R-3(0.1) | S-1 |
| Comparative Example 18 | P-1 | Q-3 | R-3(0.1) | S-1 |

According to the above-described procedures, 27 kinds of photosensitive/heat-sensitive image forming materials of Examples 1-1 to 1-9 and Comparative Examples 1 to 18 were prepared. These materials were subjected to the following evaluations.

Evaluation of Sensitivity

The photosensitive/heat-sensitive materials were exposed to and scanned by a semiconductor laser emitting infrared rays in the wavelength range of about 830 to 850 nm. After the exposure, the materials were thermally treated at 110° C. for 15 seconds with a panel heater, and then processed with a developing solution DP-4 manufactured by Fuji Photo Film Co., Ltd. (by dilution with water at a ratio of 1:8). The energy amount required for recording was calculated based on the line widths of the image obtained, laser output power, optical loss, and scanning speed, and the value obtained was used as an indicator of sensitivity.

Evaluation of Storage Stability

The above-described photosensitive materials before exposure to laser were left in a highly humid condition (75% RH at 45° C.) for 3 days, then exposed to a laser in the same way as above, and the amount of energy required for recording was calculated. In this way, the energy ratio of the materials before and after storage in the highly humid condition (energy required after the storage in the highly humid condition/energy required before the storage in the highly humid condition) was calculated.

An energy ratio of 1.1 or less is desirable from the standpoint of manufacture and can be said to indicate good storage stability.

These results are shown in Table 13.

TABLE 13

| | Sensitivity (mJ/$cm^2$) | Storage stability (ratio) |
|---|---|---|
| Example 1-1 | 1.3 | 1.1 |
| Example 1-2 | 2.0 | 1.1 |
| Example 1-3 | 1.0 | 1.0 |
| Example 1-4 | 0.7 | 1.1 |
| Example 1-5 | 1.7 | 1.01 |
| Example 1-6 | 1.0 | 1.0 |
| Example 1-7 | 0.8 | 1.1 |
| Example 1-8 | 2.0 | 1.05 |
| Example 1-9 | 1.5 | 1.05 |
| Comparative Example 1 | 5.0 | 2.0 |
| Comparative Example 2 | 4.5 | 2.0 |
| Comparative Example 3 | 6.5 | 2.1 |
| Comparative Example 4 | 5.0 | 1.8 |
| Comparative Example 5 | 5.5 | 1.5 |
| Comparative Example 6 | 6.5 | 1.5 |
| Comparative Example 7 | 6.0 | 2.0 |
| Comparative Example 8 | 7.0 | 1.5 |
| Comparative Example 9 | 5.0 | 2.0 |
| Comparative Example 10 | 300 | 1.1 |
| Comparative Example 11 | 250 | 1.1 |
| Comparative Example 12 | 300 | 1.1 |
| Comparative Example 13 | 200 | 1.1 |
| Comparative Example 14 | 200 | 1.0 |
| Comparative Example 15 | 300 | 1.0 |
| Comparative Example 16 | 200 | 1.05 |
| Comparative Example 17 | 200 | 1.0 |
| Comparative Example 18 | 300 | 1.1 |

As shown in Table 13, the photosensitive materials of the present invention were confirmed to have high sensitivity and good storage stability.

Further, the 27 kinds of photosensitive/heat-sensitive image forming materials of Examples 2-1 to 2-9 and Comparative Examples 1 to 18, which were prepared as described above, were subjected to the following evaluations.

Evaluation of Adhesion 1

The image forming materials were exposed to and scanned by a semiconductor laser emitting infrared rays in the wavelength range of about 830 to 850 nm so as to form 100 dots each having a diameter of 20 μm. After the exposure, the exposed materials were thermally treated at 110° C. for 15 seconds with a panel heater.

After that, the materials were processed with a developing solution DP-4 (trade name) manufactured by Fuji Photo Film Co., Ltd. (by dilution with water at a ratio of 1:8). A commercially available cellophane tape was then adhered to the image portions thus obtained and a load of 0.2 kg/$cm^2$ was placed on the cellophane tape for 30 minutes. The cellophane tape was then peeled off. After the removal of the cellophane tape, the number of dots remaining on the support was counted and used as an indicator of adhesion.

Evaluation of Adhesion 2: Plate Life

The image forming materials were exposed to and scanned by a semiconductor laser emitting infrared rays in the wavelength range of about 830 to 850 nm so as to form 1% dots (highlight). After the exposure, the exposed materials were thermally treated at 130° C. for 75 seconds with a panel heater.

After that, the materials were processed with a developing solution DP-4 (trade name) manufactured by Fuji Photo Film Co., Ltd. (by dilution with water at a ratio of 1:8). By using the thus-processed photosensitive materials as printing plates, prints were produced using a Hidel KOR-D printer. The numbers of prints produced were compared as indicators of adhesion by regarding a practically desirable level shown by Example 2 as the standard (100). An indicator of 100 or greater is regarded as good and desirable from the standpoint of manufacture.

Evaluation of Storage Stability

The above-described image forming materials before exposure to laser were left in a highly humid condition (75% RH at 45° C.) for 3 days. By using printing plates derived from the photosensitive materials thus stored, prints were produced in the same way as above, and stains in non-image portions were examined. If the storage stability of the photosensitive materials is inferior, image recording performance is degraded, developability is lowered, and stains are generated at non-image portions.

These results are shown in Table 14.

TABLE 14

| | Adhesion (number of dots) | Adhesion (indicator of plate life) | Storage stability (stains) |
|---|---|---|---|
| Example 2-1 | 90 | 110 | None |
| Example 2-2 | 100 | 100 | None |
| Example 2-3 | 95 | 110 | None |
| Example 2-4 | 90 | 110 | None |
| Example 2-5 | 90 | 100 | None |
| Example 2-6 | 85 | 105 | None |
| Example 2-7 | 90 | 110 | None |
| Example 2-8 | 100 | 110 | None |
| Example 2-9 | 85 | 120 | None |
| Comparative Example 1 | 30 | 20 | Stained |
| Comparative Example 2 | 10 | 15 | Stained |
| Comparative Example 3 | 10 | 10 | Stained |
| Comparative Example 4 | 15 | 20 | Stained |
| Comparative Example 5 | 5 | 10 | Stained |
| Comparative Example 6 | 20 | 20 | Stained |
| Comparative Example 7 | 15 | 15 | Stained |
| Comparative Example 8 | 30 | 30 | Stained |
| Comparative Example 9 | 20 | 15 | Stained |
| Comparative Example 10 | 40 | 40 | None |
| Comparative Example 11 | 30 | 50 | None |
| Comparative Example 12 | 50 | 60 | None |
| Comparative Example 13 | 30 | 40 | None |
| Comparative Example 14 | 30 | 45 | None |
| Comparative Example 15 | 40 | 60 | None |
| Comparative Example 16 | 30 | 60 | None |
| Comparative Example 17 | 60 | 60 | None |
| Comparative Example 18 | 50 | 50 | None |

As is apparent from Table 14, the image forming materials of the present invention were confirmed to have excellent adhesion (long plate life) and good storage stability.

The image forming material of the present invention is a negative-type image forming material having excellent properties which include clearly discernible ON-OFF in areas irradiated/non-irradiated with various energy rays, excellent adhesion between the support and recording layer in the areas irradiated with energy rays, the capability of being engraved directly from digital data of a computer or the like by using an infrared laser in particular, the capability to obtain clear and high-quality images, and high sensitivity and excellent storage stability.

What is claimed is:

1. An image forming material comprising:

(a) an acid-crosslinkable layer containing a first compound that generates an acid when subjected to at least one of light and heat, and a second compound crosslink able by said acid, the second compound having an alkali solubility which is lowered when crosslinked with said acid;

(b) a radical-polymerizable layer, containing one compound that generates a radical when subjected to at least one of light and heat and another compound capable of undergoing a radical polymerization and whose alkali solubility is lowered by said radical polymerization; and (c) a support on which at least one of the layers is disposed, with the other layer being disposed on said at least one of the layers;

wherein at least one of the layers includes an infrared absorbent.

2. An image forming material according to claim 1, wherein the acid-crosslinking layer (a) and the radical-polymerizable layer (b) are disposed in that order on the support (c).

3. An image forming material according to claim 1, wherein the radical-polymerizable layer (b) and the acid-crosslinking layer (a) are disposed in that order on the support (c).

4. An image forming material according to claim 1, wherein the acid-crosslinkable layer includes solid components, and the first compound that generates an acid when subjected to at least one of light and heat, generates an acid which is a strong acid having a pKa of no more than 2, with the first compound comprising 0.01 to 50% by weight based on total weight of the solid components of the acid-crosslinkable layer.

5. An image forming material according to claim 1, wherein the compound crosslinkable by the acid generated is selected from a low-molecular-weight phenol derivative, a polynuclear phenolic crosslinking agent, and a mixture of the low-molecular-weight phenol derivative and the polynuclear phenolic crosslinking agent and/or a resol resin, and the compound crosslinkable by the acid is added to the acid-crosslinkable layer in an amount of 5–70% by weight based on the total weight of the solid components of the acid-crosslinkable layer.

6. An image forming material according to claim 1, wherein the acid-crosslinkable layer includes a binder polymer having at least one of a side chain and a main chain, with an aromatic hydrocarbon ring, to which at least one of a hydroxyl group and an alkoxy group is directly linked.

7. An image forming material according to claim 6, wherein the binder polymer comprises a material selected from the group consisting of a phenolic resin, and a polymer having a structural unit represented by a general formula (III) as follows, in a proportion by 50 to 100% by weight of the total weight of the binder polymer:

General Formula (III)

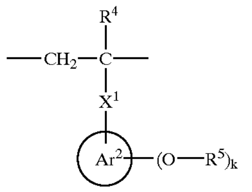

wherein $Ar^2$ represents a benzene ring, a naphthalene ring, or an anthracene ring; $R^4$ represents a hydrogen atom or a methyl group; $R^5$ represents a hydrogen atom or an alkoxy group having no more than 20 carbon atoms; $X^1$ represents either a single bond or a bivalent linking group which contains at least one atom selected from C, H, N, O, and S and has 0 to 20 carbon atoms; and k is an integer from 1 to 4.

8. An image forming material according to claim 7, wherein the phenolic resin is a novolac resin.

9. An image forming material according to claim 7, wherein the binder polymer has an average molecular weight of at least 5,000, and a polydispersion degree, defined as the average molecular weight divided by average number molecular weight, of at least 1.

10. An image forming material according to claim 1, wherein the radical-polymerizable layer comprises as a radical generator, at least one of an azobisnitrile compound, an organic peroxide, an inorganic peroxide, an azo or diazo compound, a tetraalkylthiuram disulfide, a diaryl disulfide, a dialkylxanthogenic acid disulfide, an arylsulfinic acid, an arylalkylsulfonic acid, and a 1-alkanesulfinic acid.

11. An image forming material according to claim 10, wherein the radical-polymerizable layer includes solid components and the radical generator comprises 0.5–30% by weight based on total weight of the solid components of the radical-polymerizable layer.

12. An image forming material according to claim 1, wherein the radical-polymerizable layer comprises at least one of benzoyl oxide and 2,2'-azobisisobutyronitrile as a radical generator.

13. An image forming material according to claim 1, wherein said another compound comprises a polymerizable molecule with at least two acryl or methacryl groups, and has a molecular weight of no more than 10,000.

14. An image forming material according to claim 1, wherein the radical-polymerizable layer includes solid components and said another compound comprises a polymerizable polymer having an ethylenically unsaturated group in an amount of 20–80% by weight, based on total weight of the solid components in the radical-polymerizable layer.

* * * * *